United States Patent
Fujii

(10) Patent No.: US 7,333,860 B2
(45) Date of Patent: *Feb. 19, 2008

(54) DEPENDENT POWER SUPPLYING APPARATUS AND ELECTRONIC INSTRUMENT

(75) Inventor: Tatsuya Fujii, Nishinomiya (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/234,479

(22) Filed: Sep. 23, 2005

(65) Prior Publication Data

US 2006/0020351 A1    Jan. 26, 2006

Related U.S. Application Data

(63) Continuation of application No. 10/107,466, filed on Mar. 26, 2002, now Pat. No. 6,952,619.

(30) Foreign Application Priority Data

Mar. 26, 2001  (JP) ............................. 2001-086584

(51) Int. Cl.
*G05B 11/01*   (2006.01)
*H04B 1/00*    (2006.01)

(52) U.S. Cl. .................. 700/22; 700/297; 455/574

(58) Field of Classification Search .............. 700/22, 700/297; 307/18, 64, 66; 455/574, 67.11, 455/343.1, 517, 127.1
See application file for complete search history.

(56) References Cited

U.S. PATENT DOCUMENTS

| 5,272,382 A | 12/1993 | Heald et al. ........... 307/66 |
| 5,806,006 A | 9/1998 | Dinkins ................ 455/574 |
| 5,898,232 A | 4/1999 | Reents et al. ........... 307/18 |
| 5,995,853 A * | 11/1999 | Park .................. 455/574 |
| 6,047,169 A * | 4/2000 | Dent .................. 455/127.5 |
| 6,140,714 A | 10/2000 | Fujii ................... 307/18 |
| 6,236,869 B1 * | 5/2001 | Adachi et al. .......... 455/572 |
| 6,282,415 B1 * | 8/2001 | Buhler et al. .......... 455/343.1 |

FOREIGN PATENT DOCUMENTS

| JP | 10-289039 | 10/1998 |
| JP | 11-265234 | 9/1999 |

\* cited by examiner

*Primary Examiner*—Thomas K. Pham
(74) *Attorney, Agent, or Firm*—Cooper & Dunham LLP

(57) ABSTRACT

A semiconductor power supplying apparatus driven by a power source includes at least two driven circuits for performing prescribed data processing when electric power is supplied. An electric power supplying circuit is provided so as to convert power from the power source as needed to supply at least two driven circuits with electric power in accordance with voltages that the driven circuits need. A driven circuit power supplying condition signal generating device is provided so as to generate a driven circuit power supplying condition signal for determining a power supplying condition of all of the at least two driven circuits. A power supplying control signal generation circuit is also provided so as to generate a power supplying control signal for controlling the operation of the power supplying circuit. The power supplying control signal is generated from the driven circuit power supplying condition signal and determines an order of supplying power to the at least two driven circuits so that the at least two driven circuits can receive dependent power supplying.

14 Claims, 23 Drawing Sheets

FIG. 3

| 1 * | 2~n (VOLTAGE INPUT SECTION) |
|---|---|
| OFF | ALL IS OFF |
| ON | ONLY WHEN a IS ON, b IS POSSIBLE TO ON/OFF |
| ON | ONLY WHEN c IS ON, d IS POSSIBLE TO ON/OFF, & c RISES EARLIER THAN d WHEN c & d ARE SIMULTANEOUSLY ON, & d RISES EARLIER THAN c WHEN c & d ARE SIMULTANEOUSLY OFF |
| ON | f IS POSSIBLE TO ON/OFF, ONLY WHEN e1~en-1 ARE ON |

*: CONDITION WHEN PRIMARY POWER SUPPLYING CIRCUIT IS ON & VOLTAGE DETECTION SIGNAL IS HIGH

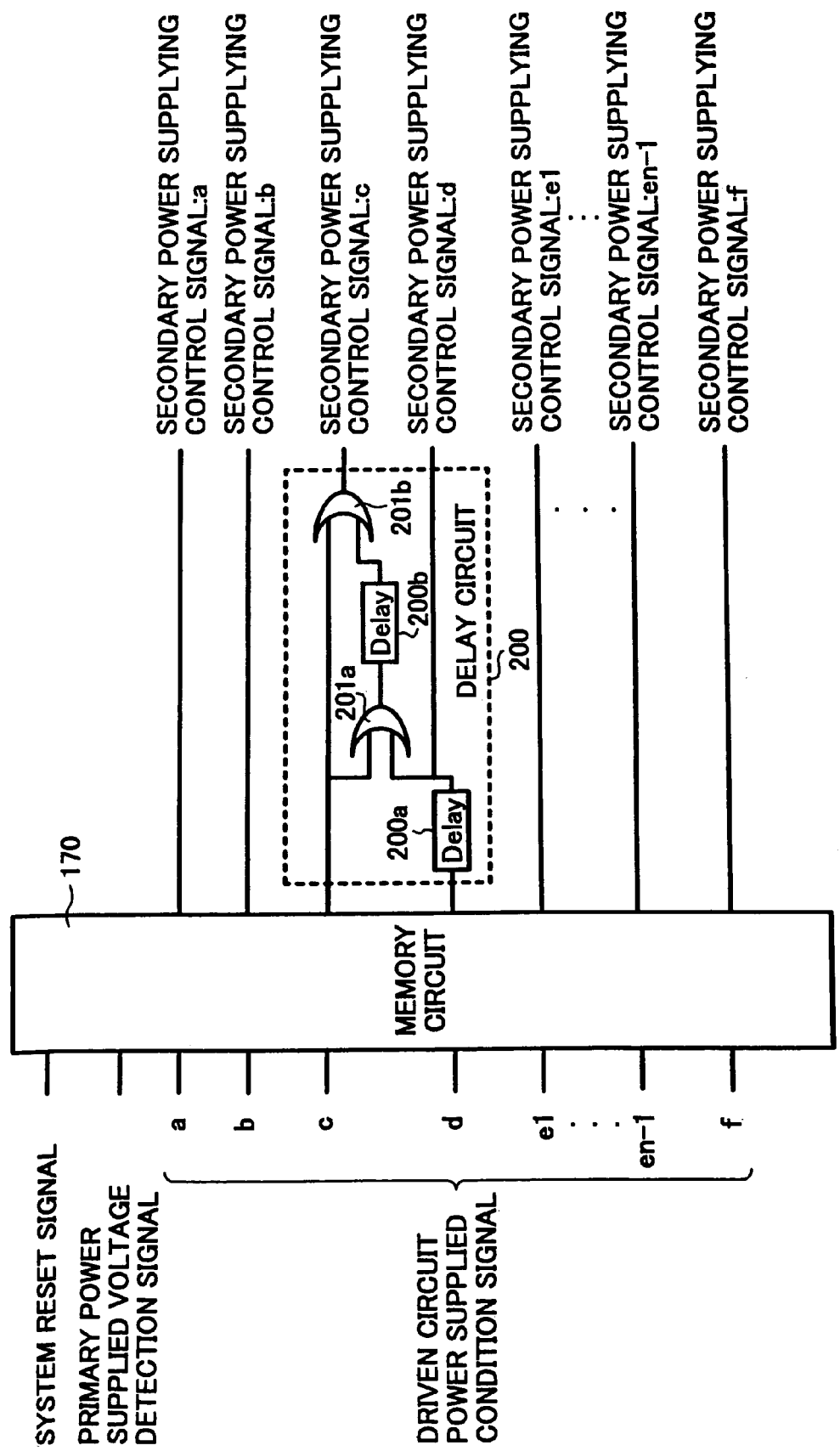

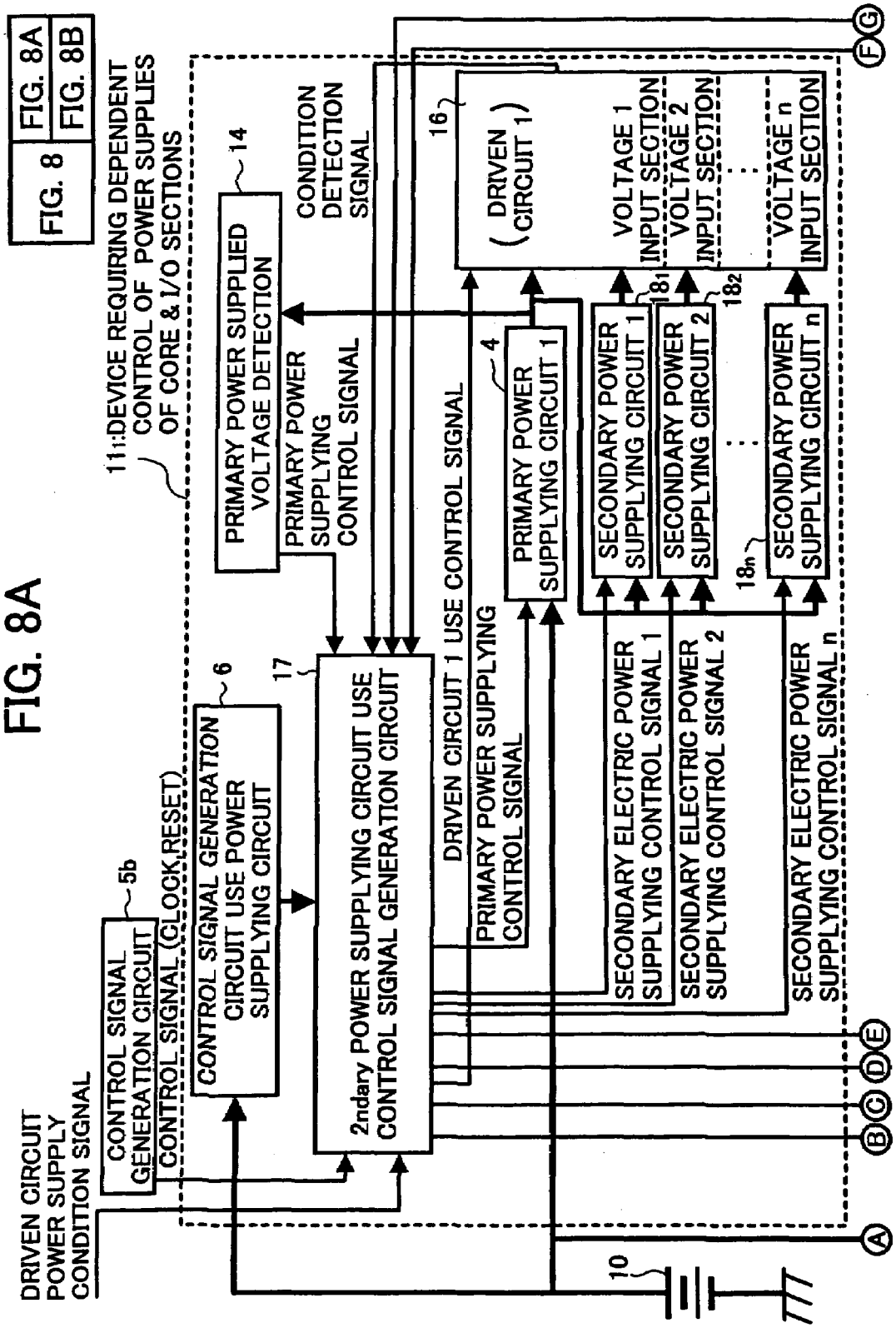

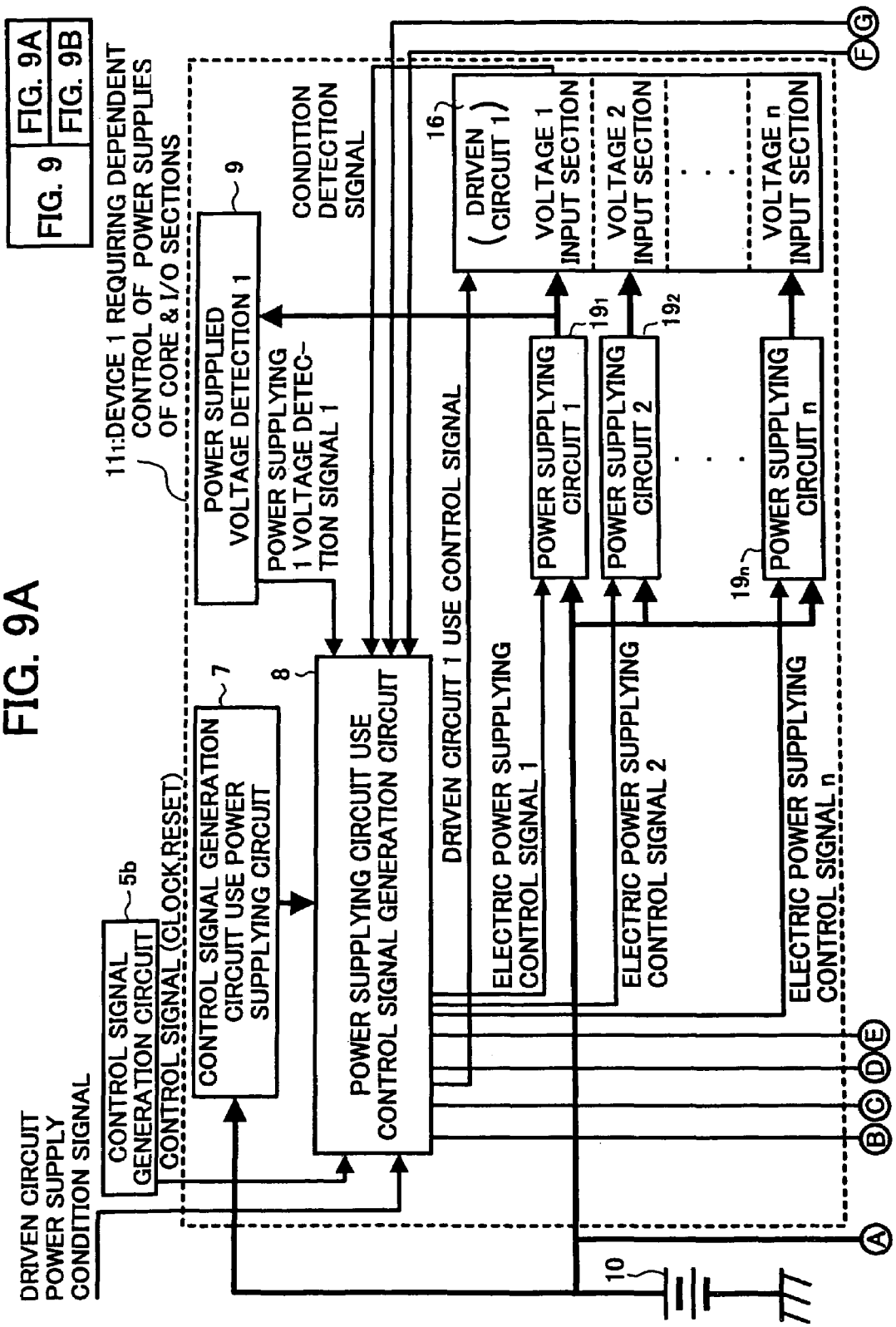

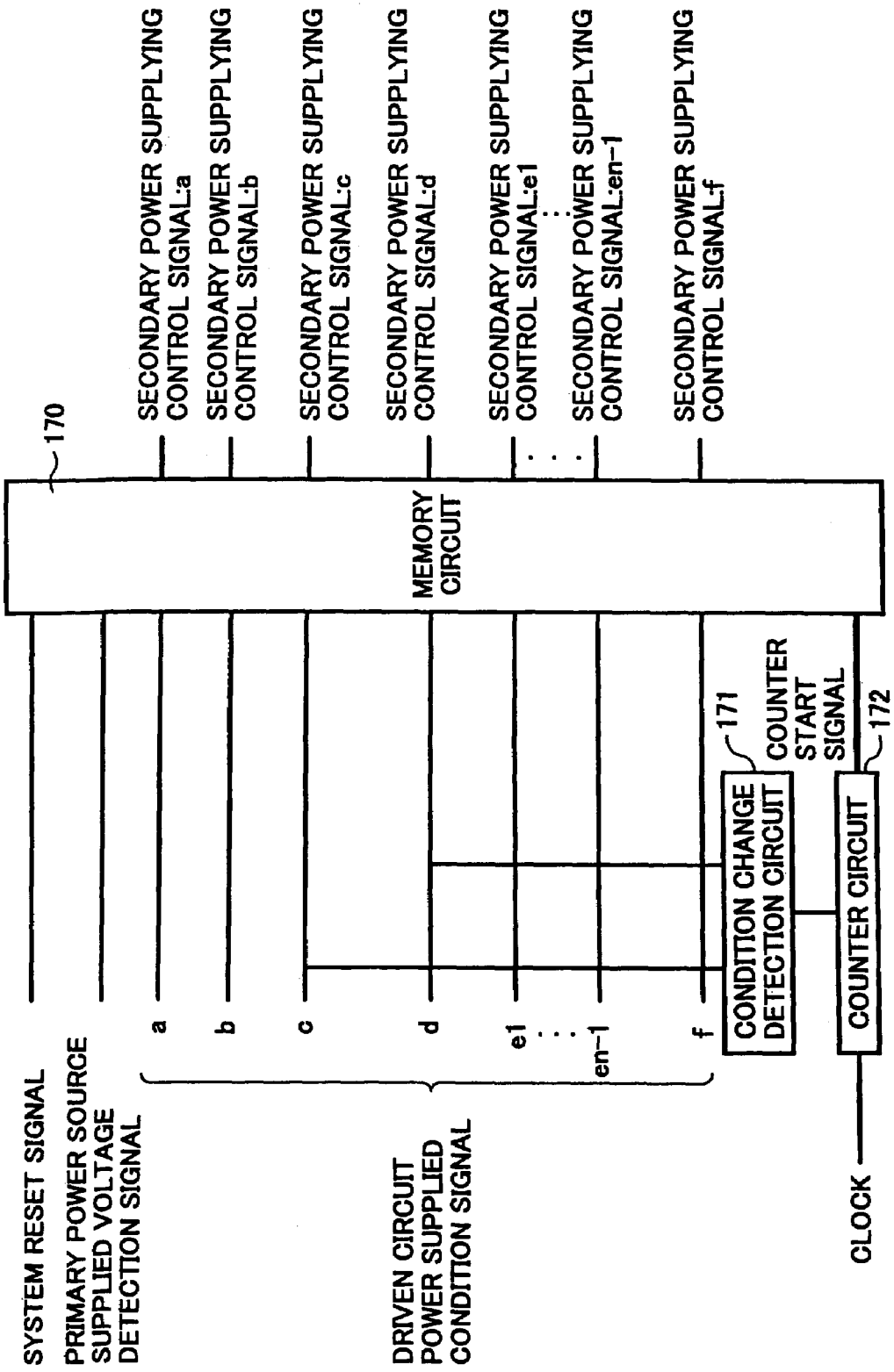

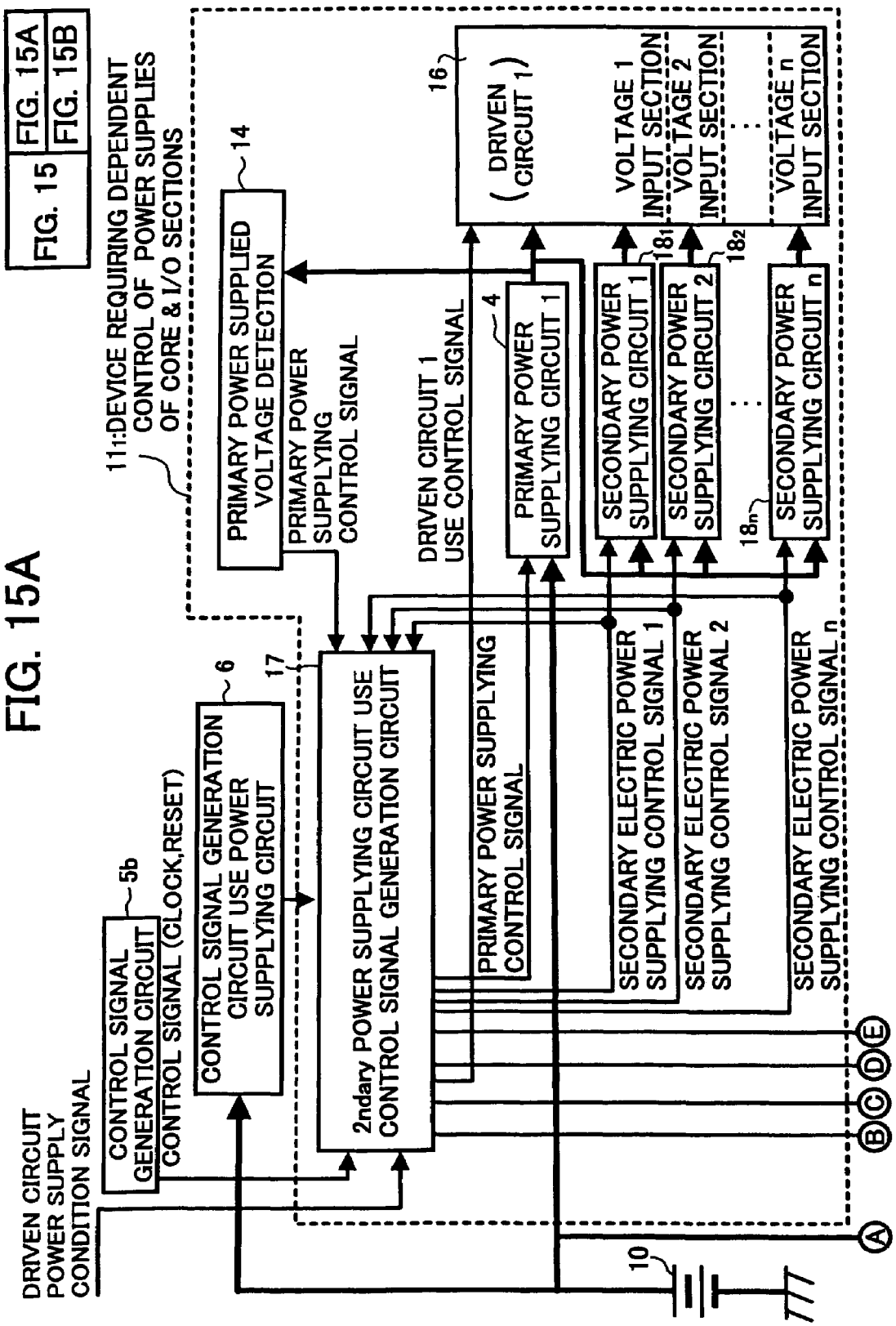

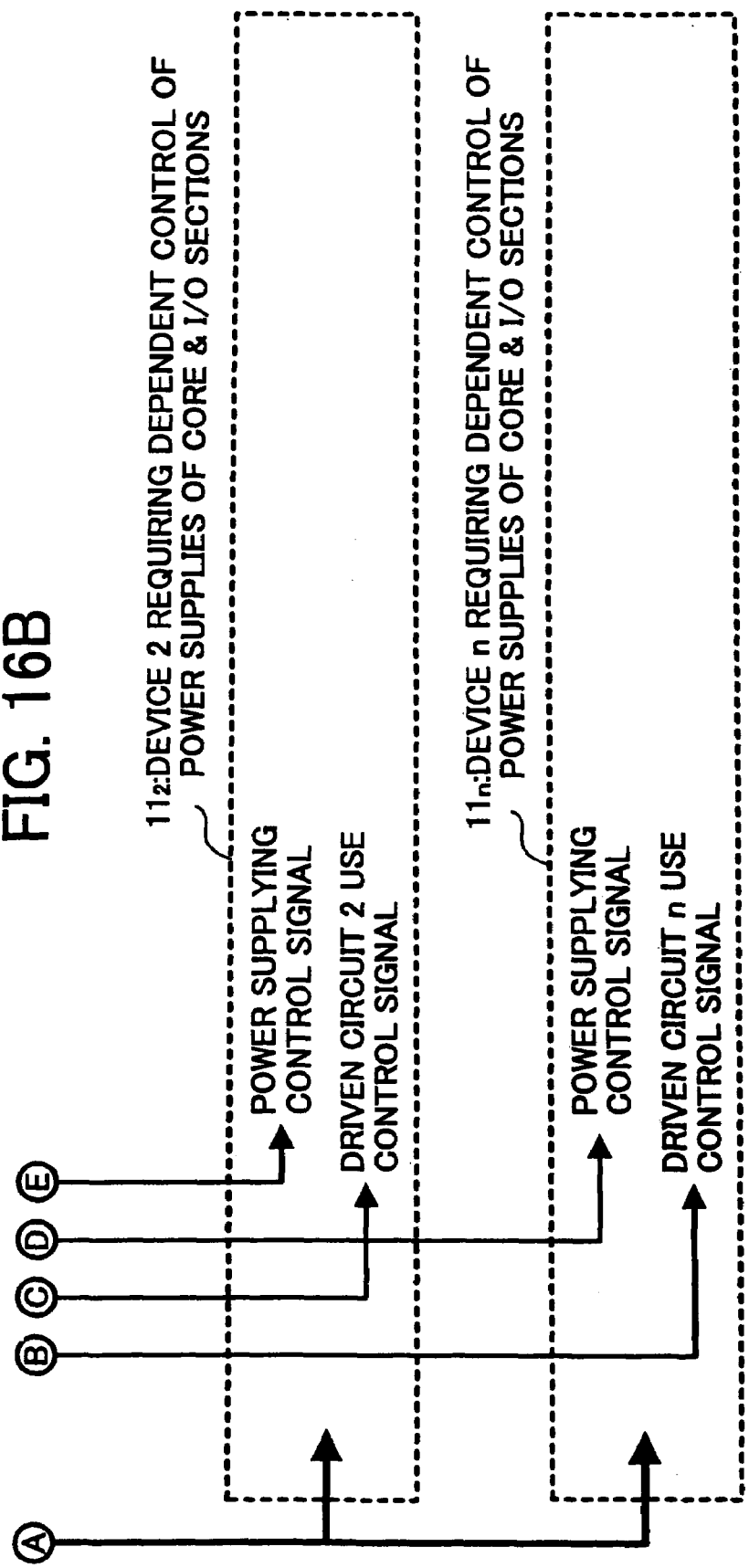

DEPENDENT POWER SUPPLYING APPARATUS AND ELECTRONIC INSTRUMENT

CROSS REFERENCE TO RELATED APPLICATIONS

This application is a Rule 1.53(b) continuation of U.S. Ser. No. 10/107,466, filed Mar. 26, 2002 now U.S. Pat. No. 6,952,619 the entire contents of which are herein incorporated by reference.

BACKGROUND

1. Field

This patent specification generally relates to power supplies, and more particularly, to power supplies suitable for instruments such as mobile phones and information terminals using batteries as electric power sources.

2. Discussion of Background

Mobile phones, mobile information terminals, and similar devices include power supplies using batteries as electric power sources and convert a voltage into a prescribed level and supply each function block such as a processor of the mobile phone therewith.

Japanese Patent Application Laid Open No. 11-265234 refers to a power supply that attempts to lower power consumption by controlling a power supplying circuit such as a DC/DC converter, a voltage regulator, etc., to be dependently driven.

Such a power supply is illustrated in FIG. 17, and supplies a driven circuit 65 with electric power from a first battery 70 via a power supplying circuit 62 and diode 64. Electric power from a second battery 61 is also supplied to a driven circuit 65 via a diode 63.

The second battery 61 and diode 63 are provided as a backup when other power is blocked.

One or more primary power supplying circuits 71 are connected to battery 70. To the primary power supplying circuits 71, a secondary power supplying circuit 72 is connected. The primary power supplying circuits 71 supply a first driven circuit 81 with electric power, for example of 3.0 v, via a power source line 91. The secondary power supplying circuit 72 supplies a second driven circuit 82 with electric power, for example of 2.0 v, via a power source line 92. The first and second driven circuits 81 and 82 are connected to each other via a data line 83. The second driven circuit 82 receives and processes the data that is output from the first driven circuit 81 via the data line 83. The first driven circuit 81 receives and further processes the data that is output from the second driven circuit 82.

These first and second driven circuits 81 and 82 do not necessarily simultaneously start operations. Specifically, the first driven circuit 81 operates from time to time. The second driven circuit 81 operates only whenever the first driven circuit 81 operates, i.e., never operates alone.

A control circuit 73 is provided and includes a voltage detection circuit 130 and a secondary electric power control section 131. The control circuit 73 is ready to supply a scheduled voltage when the primary electric power supplying circuit 71 starts operating and a prescribed time has elapsed thereafter. A first voltage detection section provided in the voltage detection circuit 130 outputs a High signal to the secondary electric power control section 131 when a supplied voltage to the primary electric power supplying circuit 71 reaches a prescribed level. In addition, a first oscillation section provided in the secondary electric power control section 131 starts oscillation when the primary electric power supplying circuit 71 starts operating. However, the first oscillation section requires a prescribed period of time until the oscillation condition is stabilized.

A primary reset signal generation section provided in the secondary electric power control section 131 includes a pair of flip-flops, and outputs a High reset signal after a prescribed period of time has elapsed when a first voltage detection section of the voltage detection circuit 130 outputs a High signal. The reset signal is given to the first driven circuit 81. The first driven circuit 81 receiving the High reset signal achieves the above-described stable oscillation output at that time, and starts operating with a necessary electric power via an power source line 91 from the primary electric power supplying circuit 71.

After having processed and transferring data to the second driven circuit 82, the first driven circuit 81 gives an instruction signal to the secondary power supply control signal generation section of the secondary electric power control section 131 so as to enable the second driven circuit 82 to operate. When receiving the instruction signal, the secondary power supply control signal generation section gives a secondary electric power supplying control signal to both the secondary power supplying circuit 72 and a second voltage detection section provided in the voltage detection circuit 130. In addition, a detection output of the first voltage detection section is input to the secondary electric power supply control signal generation section. The secondary electric power supply control signal generation section controls the secondary electric power supplying circuits 72 not to operate even if receiving the above-described instruction signal, until obtaining a High signal as the above-described detection output. The secondary electric power supply control signal generation section controls the secondary power supplying circuit 72 to stop operating when the above-described detection output is a Low signal.

When receiving the secondary electric power supply control signal of a High level, the second voltage detection section starts detecting. In addition, the secondary power supplying circuit 72 starts operating upon receiving the secondary electric power supply control signal. When the secondary power supplying circuit 72 starts operating, a condition capable of supplying a scheduled voltage is established a prescribed period of time thereafter.

The second voltage detection section of the voltage detection circuit 130 outputs a High signal to the secondary electric power control section 131 when a supplied voltage to the secondary power supplying circuit 72 reaches a prescribed level. In addition, a second oscillation section of the secondary electric power control section 131 starts oscillating when the secondary power supplying circuit 72 starts operating, and requires a prescribed period of time until the oscillation condition becomes stable.

The second reset signal generation section of the secondary electric power control section 131 outputs a reset signal of a High level after a prescribed period of time has elapsed from when the second voltage detection section of the voltage detection circuit 130 outputs a High signal. The reset signal is given to the second driven circuit 82. After receiving the reset signal of the High level, the second driven circuit 82 achieves the above-described stable oscillation output from that time, and starts operating with necessary electric power supplied via the power source line 92 from the secondary electric power supplying circuit 72. In addition, the above-described second oscillation section and second reset signal generation section drive with electric power supplied from the secondary electric power supplying circuit 72.

The above-described configuration can lower the power consumption when compared with a configuration in which a dependent electric power supplying circuit (i.e., a secondary electric power supplying circuit) dependently operates when a main electric power supplying circuit (i.e., a primary electric power supplying circuit) operates. Specifically, power to the dependent electric power supplying circuit can be supplied only when needed.

Recently, two or more power sources requiring dependent control are utilized in core (e.g. CPU) and I/O sections in a device (e.g. LSI) of an instrument, such as a mobile phone, a mobile information terminal, etc., including a battery as a power source.

Specifically, in such a conventional system as illustrated in FIG. 18, electrical power of a power source 101 composed of a battery is given to a driven circuit from a power supplying circuit. In addition, a control signal is given to one or more devices 1101 to 110n (i.e., dependent relation devices), in which two or more power sources used in a core section and an I/O section are to be dependently controlled, from a control signal generation circuit 102. Electric power is supplied to the dependent relation devices 1101 to 110n from the power source 101 based upon an electric power supply control signal output from an electric power supply control circuit.

A power supplying circuit 111 is provided in the dependent relation device 1101 and supplies power to a driven circuit 112, in which two or more power sources should be dependently controlled to be supplied to the core section and I/O section (i.e., a voltage input section).

In such a situation, even if a circuit section operable with a low voltage is utilized in the device 1101, the power consumption of device 1101 is not lowered because a single power source needs to match the highest voltage circuit included in the device 1101.

As illustrated in FIG. 19 as one example, each of the dependent relation devices 1101 to 110n includes a plurality of power supplying circuits 1111 to 111n, so as to supply power to the driven circuit 112. In addition, a system controller gives electric power supply control signals for turning ON/OFF a driven circuit, and controls each of the plurality of power supplying circuits 1111 to 111n.

According to this configuration, since an optimal operation voltage is supplied to the driven circuit in the device, power consumption can be lowered in a system of the type illustrated in FIG. 18. However, respective power supplying circuits 1111 to 111n should be controlled depending upon an operation speed of a system.

A technology discussed in Japanese Patent Application Laid Open No. 11-265234 can be applied to a system having the power supplying circuits 1111 to 111n having dependent relation.

Specifically, the voltage 1 input section of the driven circuit 112 of FIG. 19 which receives electric power from the power supplying circuit 1111, corresponds to the first driven circuit of FIG. 17. Whereas, the voltage 2 to n input sections thereof which receive respective electric power from the power supplying circuits 1112 to 111n corresponds to the second driven circuit.

In such a situation, the second driven circuit of the voltage 2 to n input sections can be independently controlled. Otherwise, respective third to n-th driving circuits can be connected and dependently controlled.

Further, when a device wherein two or more power supplies are to be provided in its core and I/O sections and need to be dependently controlled corresponds to the second driven circuit of Japanese Patent Application Laid Open No. 11-265234, the voltage 1 input section, which receives electric power from the primary power supply of the driven circuit, serves as the second driving circuit. Also, the voltage 2 to n input sections, which receive electric power from the secondary power supplying circuit, serve as a third driving circuit.

In such a situation, the third driving circuit of the voltage 2 to n input sections independently controls. Otherwise, respective 4 to n+1 driving circuits are connected and dependently controlled.

However, when electric power is to be supplied to a device where two or more power supplies are dependently controlled in the core and I/O sections, the voltage 1 input section is necessarily firstly supplied with electric power, and the voltage 2 to n input sections are controlled to selectively receives power supply. As a result, the above-described conventional technology is incapable of performing complex dependent power supply control by an optimal timing for the voltage 2 to n input sections.

SUMMARY

Accordingly, an object of the present disclosure is to address and resolve the above and other problems and provide a new power supplying apparatus. The above and other objects are achieved by providing a novel power supplying apparatus driven by a power source including at least two driven circuits that performs prescribed data processing when electric power is supplied. An electric power supplying circuit may be provided so as to convert and supply the at least two driven circuits with electric power transmitted from the power source in accordance with an amount of voltage that the driven circuit needs. A driven circuit power supplying condition signal generating device may be provided so as to generate a driven circuit power supplying condition signal for determining a power supplying condition of each of the at least two driven circuits. A power supplying control signal generation circuit may also be provided so as to generate a power supplying control signal for controlling the power supplying circuit to operate. The power supplying control signal may be generated from the driven circuit power supplying condition signal and determines an order of supplying power to the at least two driven circuits so that the at least two driven circuits can receive dependent power supplying.

In another embodiment, the condition may be related to turning ON/OFF the at least two driven circuits.

In yet another embodiment, the dependent power supplying is performed such that subsequently supplied one or more driven circuits are turned ON only when a main power supplying circuit is turned ON.

In yet another embodiment, the main power supplying circuit is the most frequently utilized circuit.

In yet another embodiment, the driven circuit includes core and I/O sections requiring two or more power supplies, wherein said two or more power supplies are dependently controlled.

In yet another embodiment, the dependent control is performed such that subsequently supplied one or more driven circuits are turned ON only when a main power supplying circuit is turned ON.

In yet another embodiment, the driven circuits use different amounts of power.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein:

FIG. 7 is a block chart for illustrating a specific example of another secondary power supplying circuit;

FIG. 14 is a block chart for illustrating another exemplary secondary power supplying circuit;

DETAILED DESCRIPTION OF PREFERRED EMBODIMENTS

Figure 1:
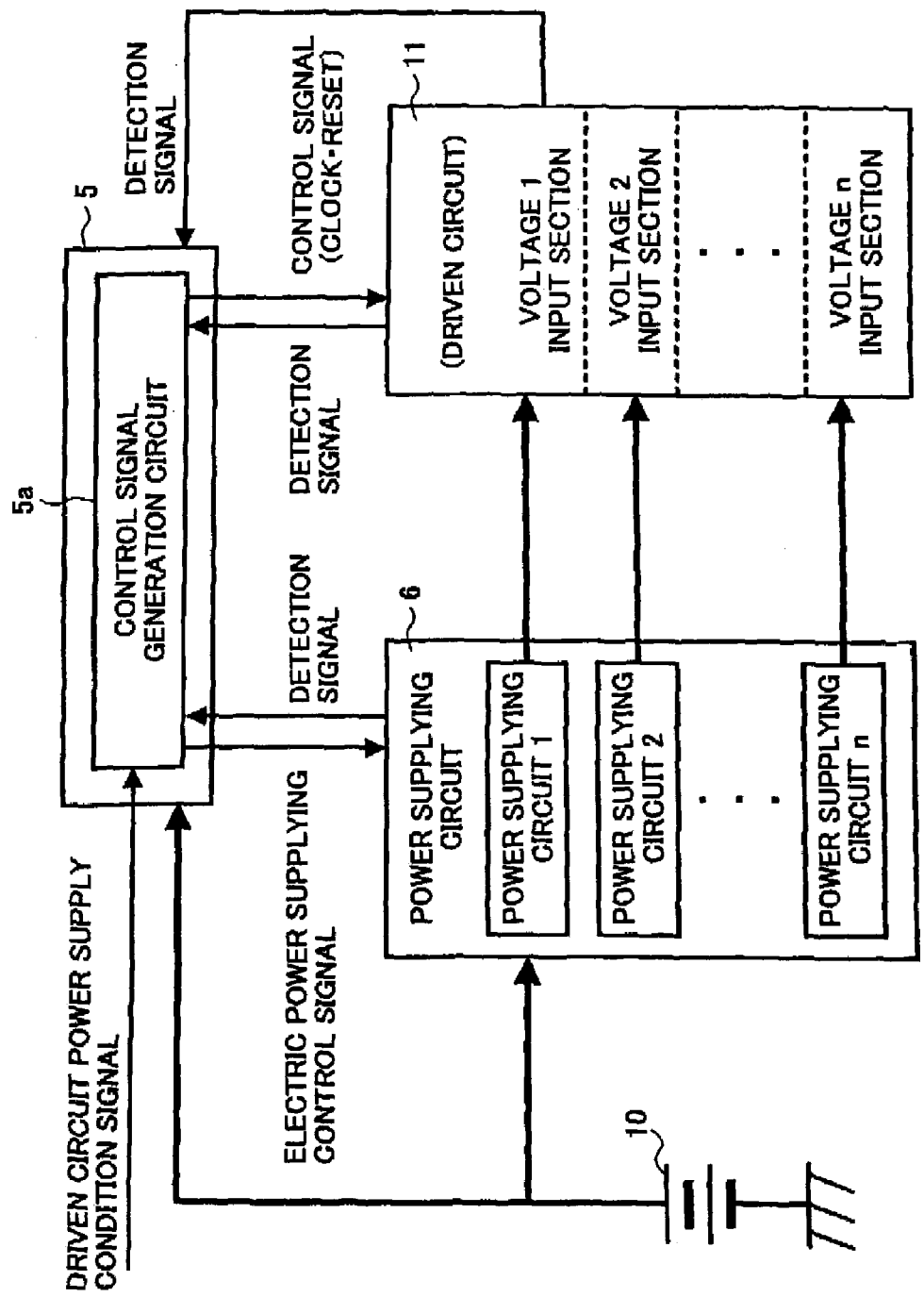
FIG. 1 is a block chart for illustrating a first embodiment of a power supply apparatus.

Referring now to the drawings, wherein like reference numerals and marks designate identical or corresponding parts throughout several figures, in particular in FIG. 1, a power supply apparatus according to the first embodiment is illustrated using a block circuit chart. A system illustrated in FIG. 1 may include a device 11 where two or more power supplies are needed in its core and I/O sections to be dependently controlled.

As illustrated in FIG. 1, electric power from a power source 10 including a battery may be supplied to a driven circuit 5 that performs a main control or the like and is a principal power supply objective. In FIG. 1, although a single circuit is described as the driven circuit 5 for convenience sake and the driven circuit 5 is practically independently configured as a main circuit, it may be configured including a part of a circuit of the driven circuit 11 as mentioned later.

Electric power from the power source 10 may be supplied to a power supplying circuit including a plurality of electric power supplying circuits.

The above-described driven circuit 5 may include a power supplying circuit and a control signal generation circuit 5a. The dependent driven circuit 11 may not operate unless the driven circuit 5 operates. The dependent driven circuit 11 may be controlled by a control signal (e.g. a timing clock, an initializing reset signal and so) on given from the control signal generation circuit 5a. A control circuit (not shown) that generally controls the entire system may supply the control signal generation circuit 5a with driven circuit power supply condition signals for determining turning ON/OFF conditions of respective driven circuits 11. The driven circuit power supply condition signal may be given at a predetermined timing so as to operate the dependent driven circuit 11.

Respective power supplying circuits 1 to n may supply two or more voltage input sections (e.g. voltage 1 to voltage n input sections) of the driven circuit 11 with electric power in accordance with voltages required therein.

To the control signal generation circuit 5a, a detection signal indicating an amount of a power supply voltage of the power supplying circuit 6 may be given. Based upon a detection signal, power may be supplied from these power supplying circuits 1 to n to the driven circuit 11. Specifically, electric power may be dependently controlled and supplied to the driven circuit 11 so that voltage 2 to n input sections are turned ON or OFF only when the voltage 1 input section is turned ON. Such dependent control is also required in order to avoid leakage of current in the device.

Thus, a plurality of operation required circuits is installed in the driven circuit 11, and a circuit in operation may be informed to the control signal generation circuit 5a with a detection signal.

The control signal generation circuit 5a may output an electric power supplying control signal for controlling respective power supplying circuits 1 to n to selectively operate based upon the above-described driven circuit power supply condition signals and the detection signal given by the applicable driven circuit 11.

As described above, the system according to the present invention of FIG. 1 includes a single device 11 in which two or more power supplies are dependently controlled in its core and I/O sections for convenience sake. However, a plurality of devices 11 can be controlled. In such a situation, the number of power supplying circuits may be increased in accordance with the number of devices.

In addition, a power supplying control signal controlling the power supplying circuit 6 to operate may be given to the power supplying circuit 6 after being generated from the timing clock and initializing reset signals, respectively input from the control signal generation circuit 5a, and a control signal, such as a driven circuit power supply condition signal input by the system controller. The respective power supplying circuits 1 to n may supply the driven circuit 11 with electric power while controlled by the above-described power supplying control signal, such as an ON/OFF control signal, a standby ON/OFF control signal, etc.

As illustrated in FIG. 1, an order of operating driven circuits in the driven circuit 11 may be controlled by a feedback signal from the driven circuit 11 when the control signal and the driven circuit power supply condition signals are received.

A circuit that first operates in the driven circuit 11 may be the voltage 1 input section. The power supplying circuit 6 may receive a driven circuit use electric power from the battery or power source 10 such as a system stabilizing power supplying circuit, and supply such electric power to an applicable driven circuit of the first operation required voltage 1 input section.

Respective power supplying circuits 2 to n may also receive driven circuit use electric power from the power supplying circuit 6, and then supply such electric power to the second and later circuits among the driven circuit in the electric power 2 to n input sections.

The control signal generation circuit 5*a* may receive all of a driven circuit power supplying condition signal from the system, a control signal such as a timing clock signal, an initializing reset signal, etc., and a power supply voltage detection signal from the voltage detection circuit provided in the power supplying circuit 6. The control signal generation circuit 5*a* may then output a driven circuit use control signal such as a driven circuit use clock, a reset signal, etc., and electric power supplying control signals 1 to n.

In accordance with the electric power supplying control signals 1 to n, turning ON/OFF conditions of the respective voltage 2 to n input sections, and its timing and order may be dependently controlled. As a result, power consumption can be lowered. In addition, the control signal generation circuit 5*a* by detection may receive feedback of a detection signal from the driven circuit 11, and driving may be performed in a prescribed order in accordance with the condition of the driven circuit 11.

A more specific second embodiment is now described with reference to FIG. 2. The second embodiment may constitute the control signal generation circuit (5*a*) of FIG. 1 with a first control signal generation circuit 5*b* for generating timing clock and initializing reset signals, and a secondary power supplying circuit use control signal generation circuit 17 that is provided in a device 11 in which two or more power sources disposed in its core and I/O sections should be dependently controlled to be supplied. Also in a driven circuit 16 provided in the device 11, plural circuits to which the delivery of respective power should be dependently controlled are provided in its core and I/O sections.

Figure 2:
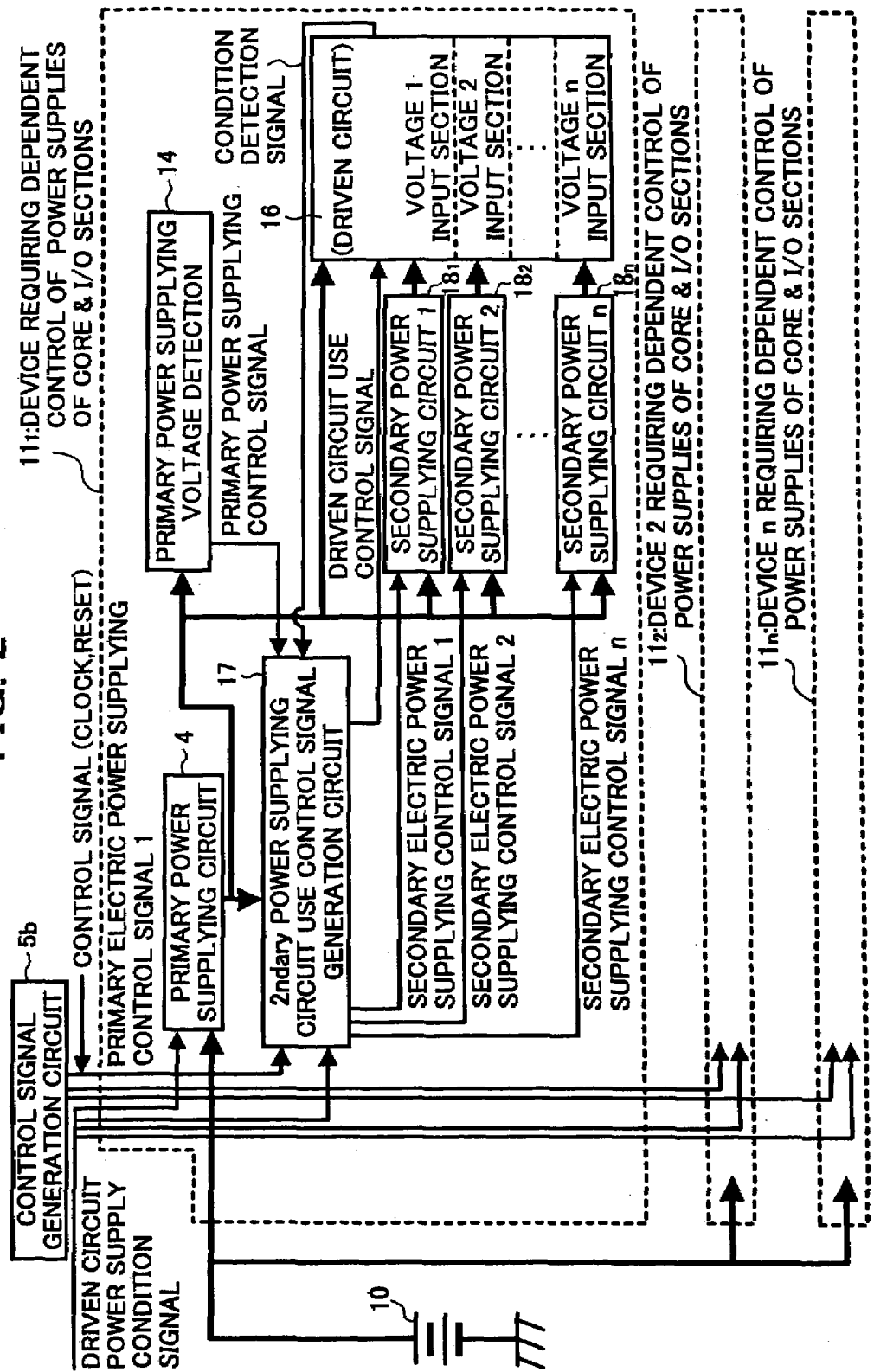
FIG. 2 is a block chart for illustrating a second embodiment of the power supply apparatus.

In the embodiment of FIG. 2, a plurality of devices 111 to 11*n*, in which two or more power supplies that need to be dependently controlled are provided to core and I/O sections, may operate after a driven circuit (not shown) including a control signal generation circuit 5*b* operates. Then, a circuit of the driven circuit 16 in respective devices 111 to 11*n* may dependently be supplied with power at a prescribed timing. An operation performed after a power is supplied to the device 111 from the power source 10 may be described below.

The device 111 may include a driven circuit 16 in which two or more power supplies of core and I/O sections should be dependently controlled.

The device 111 may include a device use primary power supplying circuit 4, and plural device use secondary power supplying circuits 181 to 18*n* for supplying electric power. The power source 10 may supply the primary power supplying circuit 4 with electric power. The primary power supplying circuit 4 may then supply the secondary power supplying circuit use control signal generation circuit 17, secondary power supplying circuits 181 to 18*n*, and the driven circuit 16 with electric power. A primary power supply voltage detection circuit 14 may detect a voltage of the primary power supplying circuit 4. The detection signal may be given to the secondary power supplying circuit use control signal generation circuit 17 as a primary power supplying control signal.

When starting operation, the primary power supplying circuit 4 may be ready to supply a prescribed voltage after a prescribed time period has elapsed. The primary power supply voltage detection circuit 14 may give a High signal to the secondary power supplying circuit use control signal generation circuit 17 when the primary power supplying circuit 4 generates the prescribed voltage.

The secondary power supplying circuits 181 to 18*n* may be correspondingly provided for respective voltage 1 to n input sections in the driven circuit 16. The secondary power supplying circuit 181 to 18*n* may convert electric power transmitted from the primary power supplying circuit 4 and supply a prescribed voltage in accordance with an amount of voltage required in a circuit of the respective voltage 1 to n input sections.

The secondary power supplying circuit use control signal generation circuit 17 may generate a secondary electric power supplying control signal such as an ON/OFF control signal, a secondary power supplying control signal such as a standby condition ON/OFF control signal, and a driven circuit use control signal such as a clock ON/OFF control signal, and a reset signal for controlling a driven circuit. These signals may be generated from a control signal, such as clock and reset signals, a driven circuit power supply condition signal transferred from the system controller, and a detection signal from the primary power supply voltage detection circuit 14.

Thus, the embodiment may be characterized in that the system receives a control signal and a driven circuit power supplying condition signal are utilized and a secondary power supplying circuit use control signal generation circuit is included.

The primary power supplying circuit 4 may receive a driven circuit use electric power from a power source 10 including a system stabilizing power supplying circuit or a battery, and supply a circuit in a voltage 1 input section, which firstly operates in the driven circuit 16, with electric power.

The secondary power supplying circuits 181 to 18*n* may receive driven circuit use electric power from the primary power supplying circuit 4 and supply respective driven circuits in the voltage 2 to n input sections subsequent to the first driven circuit, which subsequently operate in the driven circuit 16, with electric power.

The secondary power supplying circuit use control signal generation circuit 17 may be supplied with electric power by the primary power supplying circuit 4.

The secondary power supplying circuit use control signal generation circuit 17 may receive a driven circuit power supply condition signal from a system controller, a control signal such as clock and reset signals from the control signal generation circuit 5*a*, and a primary power supply voltage detection signal from the primary power supply voltage detection circuit 14. The secondary power supplying circuit use control signal generation circuit 17 may then output a driven circuit use control signal, such as a clock, a control signal e.g. a reset signal, etc., and secondary electric power supplying control signals 1 to n.

Both a turning ON/OFF condition and timing of voltage 2 to n input sections of the driven circuit 16 may be controlled and determined by secondary power supplying circuit use control signals 1 to n output from the secondary power supplying circuit use control signal generation circuit

17. As a result, power supply is dependently performed and power consumption can be lowered.

An operation of power supply is now described in more detail by mainly referring to the secondary power supplying circuit use control signal generation circuit 17.

Figure 3:
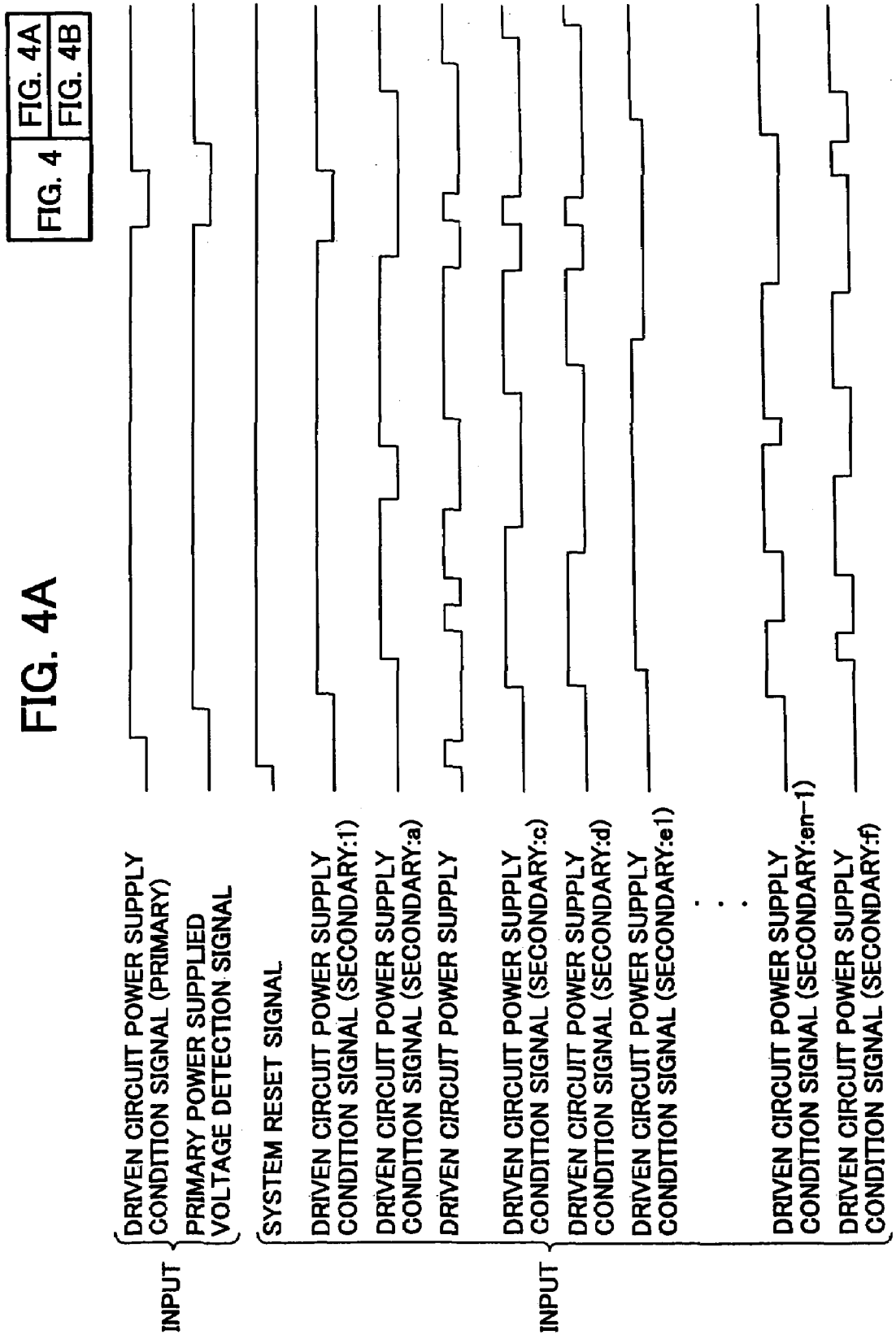
FIG. 3 is a chart for illustrating an exemplary operational condition for driven circuits.
Figure 4:
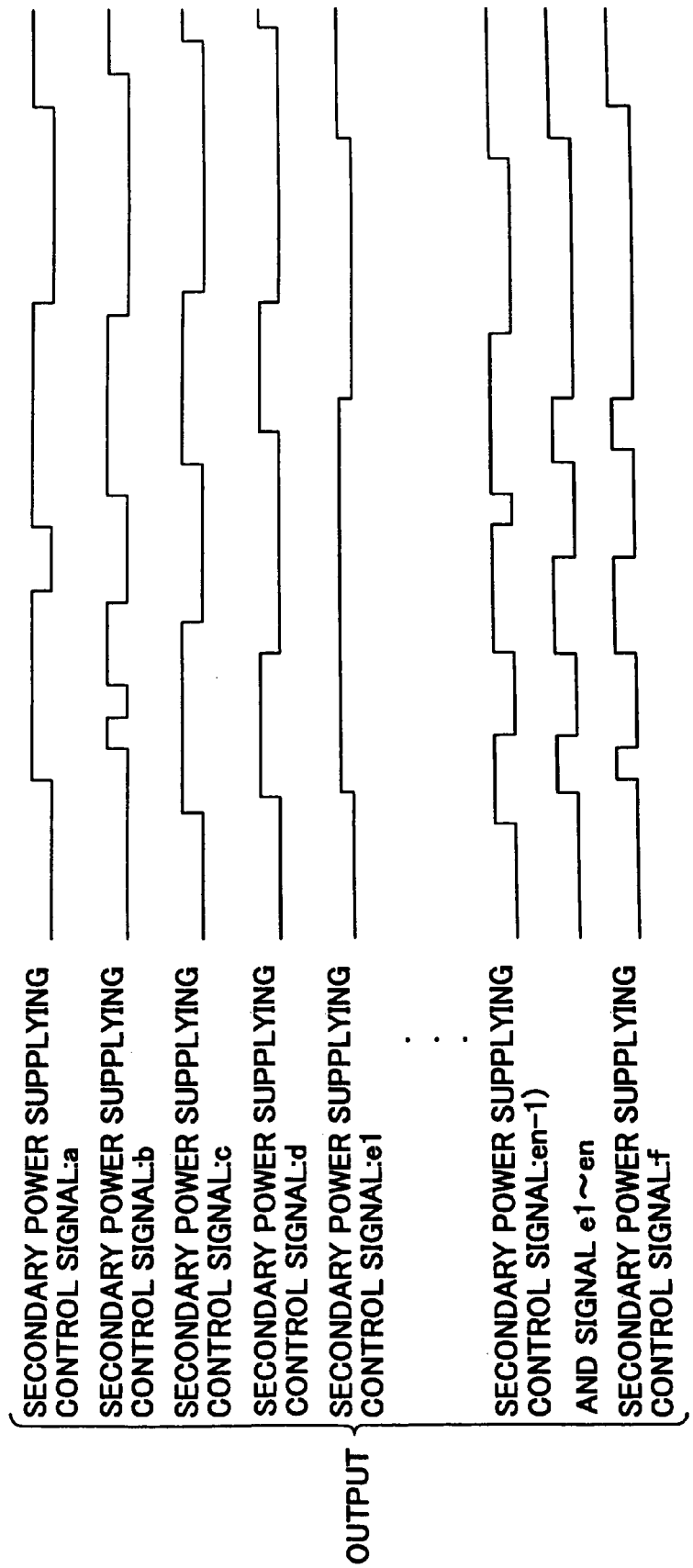
FIG. 4 is a timing chart for illustrating control signals illustrated in FIG. 3.

A relation between signals output and input to and from the secondary power supplying circuit use control signal generation circuit 17 may be illustrated in FIG. 4, when the voltage 1 to n input sections are in conditions as illustrated in FIG. 3.

Referring to FIGS. 3 and 4, the embodiment of FIG. 2 is described. Asterisk may illustrate a condition where the primary power supplying circuit 4 is turned ON, and the primary power supplying control signal (e.g. a voltage detection signal) from the primary power supply voltage detection circuit 14 is at a High level.

A circuit or circuits of the voltage 2 to n input sections of FIG. 2 may operate in accordance with the condition of FIG. 3, after a circuit of the voltage 1 input section firstly operates.

Specifically, the primary power supplying circuit 4 may be turned ON, and the primary power supplying control signal (e.g. a voltage detection signal) from the primary power supplying voltage detection circuit 14 may become a High level. Then, a system reset signal may be given to the driven circuit 16 as a driven circuit use control signal. After that, the driven circuit may be reset in accordance with electric power given from the primary power supplying circuit 4. Such reset condition may then be fed back to the secondary power supplying circuit use control signal generation circuit 17 from the driven circuit 16 as a condition detection signal.

When the circuit of the voltage 1 input section operates, secondary electric power supplying control signals may be supplied to the respective secondary power supplying circuits 182 to 18*n* from the secondary power supplying circuit use control signal generation circuit 17 so that the circuits of the voltage 2 ton input sections can operate in accordance with the condition of FIG. 3. When the circuit of the voltage 1 input section is turned OFF, all circuits of the voltage 2 to n input sections may be turned OFF due to the dependent control.

When the circuit of the voltage 1 input section is turned ON, one of voltage input sections "b" can perform ON/OFF only in a case when that of "a" is turned ON. When the circuit of the voltage 1 input section is turned ON, a voltage input section "d" can be turned ON/OFF only in a case a voltage input section "c" can be turned ON. In addition, in such a case, a section "c" may get powered earlier than a section "d" when such "c" and "d" are simultaneously turned ON. Further in such a case, a section "d" may power down earlier than a section "c" when such "c" and "d" are simultaneously turned OFF. When the circuit of the voltage 1 input section can be turned ON, a section "f" is turned ON/OFF only when sections e1 to en-1 can be turned ON. Thus, the dependent control may be performed depending upon the condition of the voltage 1 input section.

To satisfy the above-described condition, at least driven circuit power supply condition signals of FIG. 4 may be supplied to the secondary power supplying circuit use control signal generation circuit 17 from the system controller. The secondary power supplying circuit use control signal generation circuit 17 transmits secondary power supplying control signals to the respective secondary power supplying circuits 182 to 18*n* based upon a condition detection signal transmitted from the driven circuit 16 and a driven circuit power supply condition signal supplied thereto.

In FIGS. 3 and 4, "a" to "f" may correspond to the respective voltage 2 ton input sections based upon a design. For example, correspondence may be determined as appropriate in accordance with a condition of a circuit to be operated such that "a" corresponds to the voltage 2 input section, "b" corresponds to the voltage 3 input section, "e1" corresponds to the voltage 2 input section, "en-1" corresponds to the voltage n-1 input section, and "f" corresponds to the voltage n input section. In addition, depending upon intended purpose, "a" can be the voltage 1 input section.

To operate circuits of the voltage 1 to n input sections under the condition of FIG. 3, respective signals are generated as illustrated in FIG. 4 and input thereto.

The condition of FIG. 3 may be just one example, i.e., a condition can preferably be selected in accordance with a type of a driven circuit 16 to be used.

As illustrated by a time chart of FIG. 4, when a driven circuit power supply condition signal as a primary electric power supply control signal transmitted from the system controller is given to the voltage detection device 14, the primary power supplying circuit 4 may be turned ON. A voltage of the primary power supplying circuit 4 comes to a prescribed voltage level when a prescribed time has elapsed thereafter. The voltage detection signal may then become a High level.

The secondary power supplying circuit 18 may be controlled to be turned ON/OFF by a secondary power supplying control signal. An exemplary configuration of the secondary power supplying circuit 18 may be illustrated in FIG. 6. A primary power supply given from the primary power supplying circuit 4 may be given to a secondary power supplying circuit 180 provided in the secondary power supplying circuit 18. After receiving the secondary power supplying control signal and being turned ON, the secondary power supplying circuit 180 starts operating. The secondary power supplying circuit 180 may then be ready to supply a prescribed voltage when a prescribed time period has elapsed thereafter. The secondary power supply voltage detection circuit 181 may give a High signal as a reset signal to a voltage input section when the supplying voltage of the secondary power supplying circuit 180 comes to the prescribed level. The detection signal from the secondary power supply voltage detection circuit 181 may also be given to an And circuit 182 which also receives a system clock signal. A clock signal may be given to the voltage input section from the And circuit 182.

As mentioned above, the reset signal may be given to the voltage input section of the driven circuit 16. A circuit of the voltage input section having received the reset signal of the High level may receive a stable clock signal at the time and start operating with necessary electric power via a power supply line from the secondary power supplying circuit 180.

Such a configuration may reduce power consumption unlike a configuration in which another dependent electric power supplying circuit (i.e., secondary electric power supplying circuit) is always operated when the main electric power supplying circuit (i.e., primary electric power supplying circuit) operates. Specifically, electric power can be supplied to the dependent electric power supplying circuit only when it is required.

Figure 5:
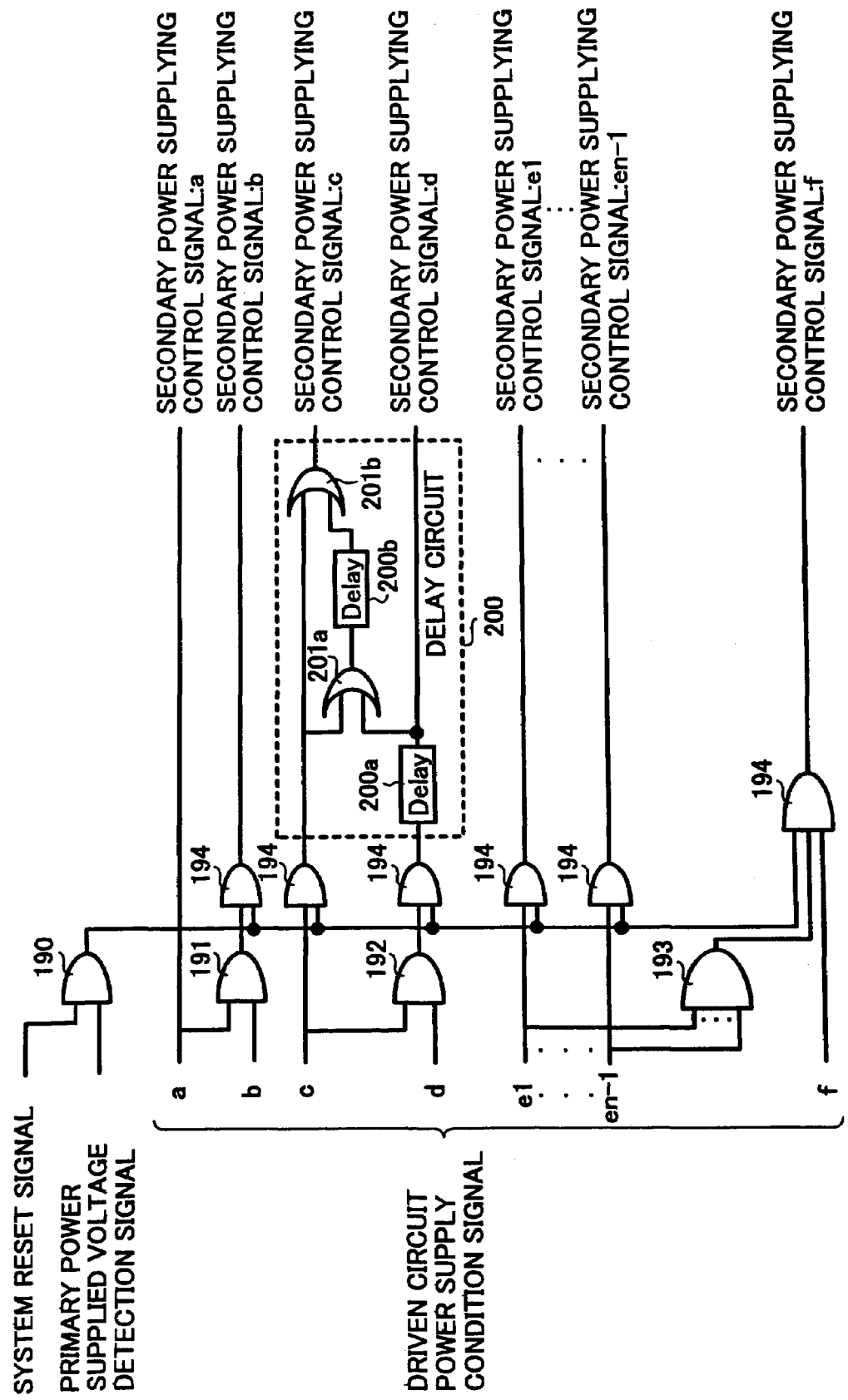
FIG. 5 is a block chart for illustrating a specific example of a secondary power supplying circuit use control circuit.

FIG. 5 is a chart illustrating a specific embodiment of the above-described secondary power supplying circuit use control signal generation circuit 17. The circuit of FIG. 5 may be configured to satisfy the condition of FIG. 3, and output a secondary power supplying control signal of FIG. 4 when receiving the primary power supply detection signal and the driven circuit power supply condition signal (i.e., secondary) of FIG. 4.

As illustrated in FIG. 5, the secondary power supplying circuit use control signal generation circuit 17 may be configured by a combination circuit composed of a plurality of And Gates 190 to 194, a pair of delay circuits 200a and 200b, and a pair of OR circuits 201a and 201b. Such a secondary power supplying circuit use control signal generation circuit 17 may receive a driven circuit power supply condition signal from a system controller, a control signal such as a reset signal from a control signal generation circuit, and a primary power supplying voltage detection signals from a primary power supplying voltage detection circuit of a device. The secondary power supplying circuit use control signal generation circuit 17 may control the combination circuit and delay circuit and then output a signal of driven circuit use control signal, such as a driven circuit use clock signal for each device, a reset signal, a primary power supplying control signal, and secondary power supplying control signals 1 to n for an applicable device.

FIG. 7 is a chart illustrating another specific embodiment of the secondary power supplying circuit use control signal generation circuit 17. The circuit of FIG. 7 may be configured similarly to the circuit of FIG. 5 so as to satisfy the condition of FIG. 3. Specifically, it may output a secondary power supplying control signal of FIG. 4, when the primary power supply detection signal and driven circuit supplying condition signal (secondary) of FIG. 4 are given.

The circuit of FIG. 7 may include a memory circuit 170 and a delay circuit 200. Such a circuit may receive a driven circuit power supply condition signal from the system, a control signal such as a reset signal from the control signal generation circuit, and a primary power supply voltage detection signal from the primary power supply voltage detection circuit of each device. The memory circuit 170 and delay circuit 200 may be controlled to output a driven circuit use control signal, such as a clock signal for each device, a control signal such as a reset signal, a primary power supplying control signal, and secondary power supplying control signals 1 to n.

A third embodiment is now described with reference to FIG. 8. In the embodiment of FIG. 2, a secondary power supplying circuit use control signal generation circuit 17 is provided in each device 11. In contrast thereto, in the third embodiment of FIG. 8, a device 111 that should be firstly operated may include a secondary power supplying circuit use control signal generation circuit that is commonly utilized by remaining devices 112 to 11n. This embodiment thus attempts to minimize a circuit scale by commonly using a control circuit use power supplying circuit.

Figure 8B:
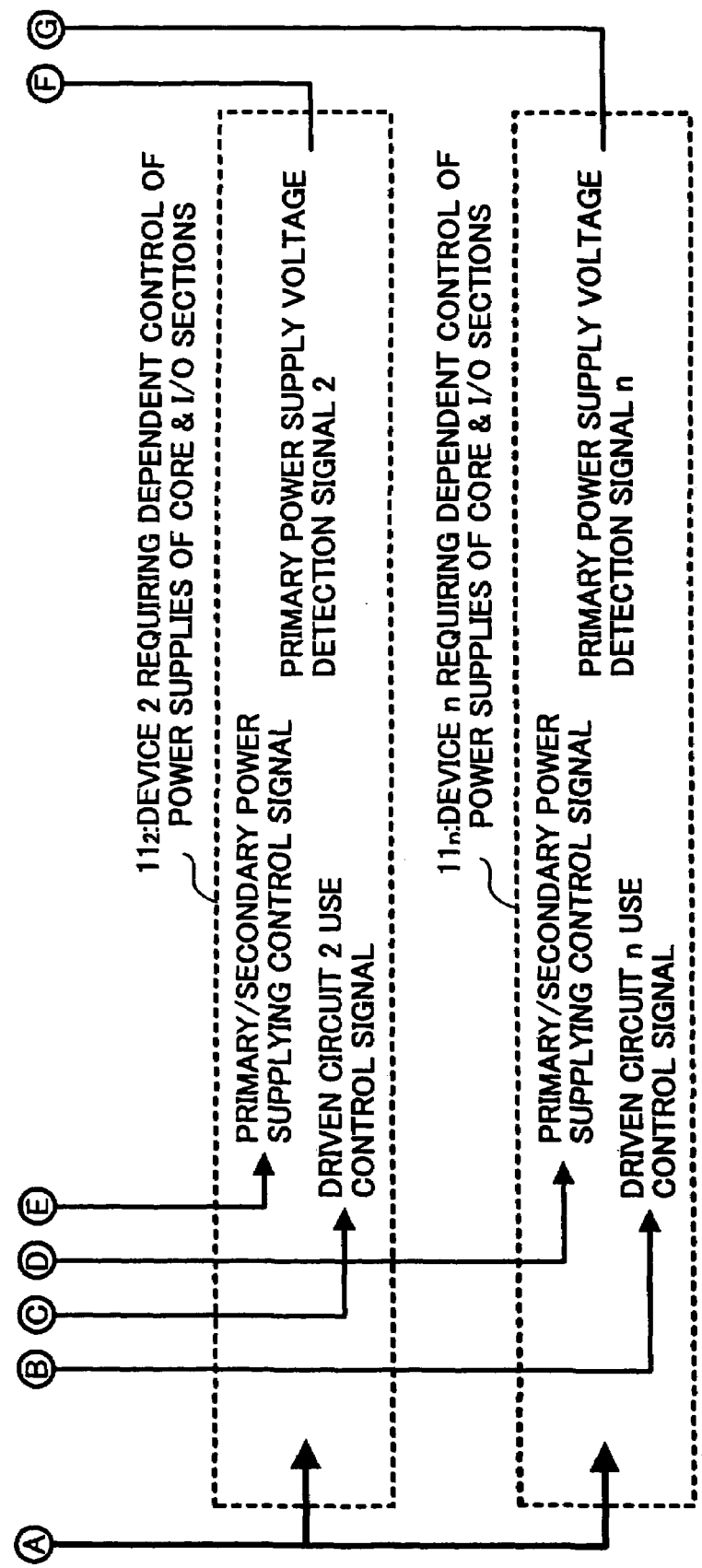
FIG. 8 is a block chart for illustrating a third embodiment of the power supply apparatus.

As noted from FIG. 8, this embodiment includes almost the same devices and functions in a similar manner as the second embodiment except for the following applicable devices and functions. A device 111 may firstly operate among devices 111 to 11n.

The secondary power supplying circuit use control signal generation circuit 17 may receive electric power from the power source 10 via the control signal generation circuit use power supplying circuit 6.

When starting operation, the primary power supplying circuit 4 may be ready to supply a prescribed voltage after a prescribed time period has elapsed. The primary power supply voltage detection circuit 14 may give a High signal to the secondary power supplying circuit use control signal generation circuit 17 when the primary power supplying circuit 4 is the prescribed voltage.

The secondary power supplying circuit use control signal generation circuit 17 may start operating while receiving electric power from the control signal generation circuit use power supplying circuit 6.

As described above, only a device 111 that should firstly operates may include a secondary power supplying circuit use control signal generation circuit 17 and a control signal generation circuit use power supplying circuit 6. Specifically, remaining devices 112 to 11n can commonly utilize these circuits. In such a way, a number of circuits can be minimized by commonly using a circuit or circuits for controlling power supply in a system. In other respects, the configuration may be similar to that of the second embodiment of FIG. 2. Further, to use the secondary power supplying circuit use control signal generation circuit 17 in remaining devices 112 to 11n, condition detection signals output from the respective devices 112 to 11n may be given to the secondary power supplying circuit use control signal generation circuit 17.

Figure 6:
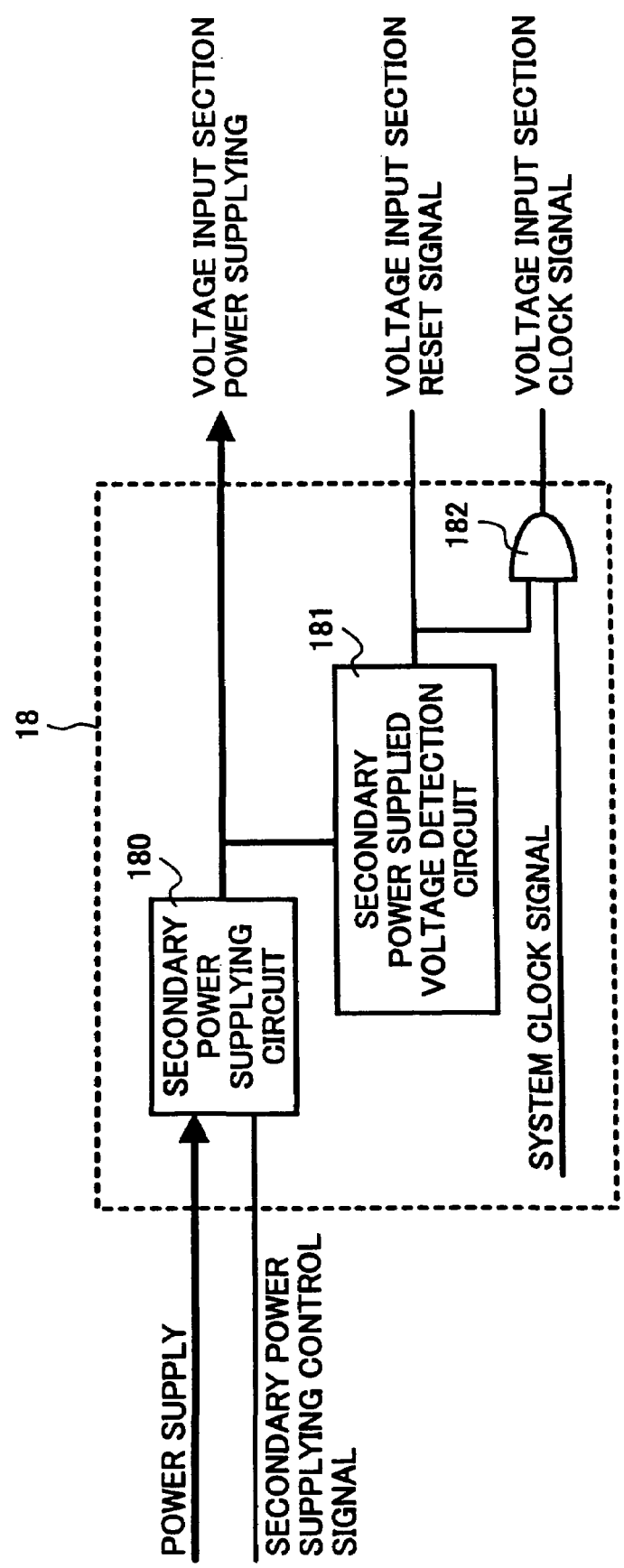
FIG. 6 is a block chart for illustrating an exemplary secondary power supplying circuit.

Signals to be generated by the secondary power supplying circuit use control signal generation circuit 17 may be generated similarly to those generated as illustrated in FIGS. 3 and 4. In addition, a specific circuit therefor may be configured as illustrated in FIGS. 6 and 7.

Thus, a circuit may be decreased in scale.

Further, the circuit may be decreased in scale by commonly using a secondary power supplying circuit use control signal generation circuit 17, and generating respective secondary electric power supplying control signals 1 to n.

Figure 9B:
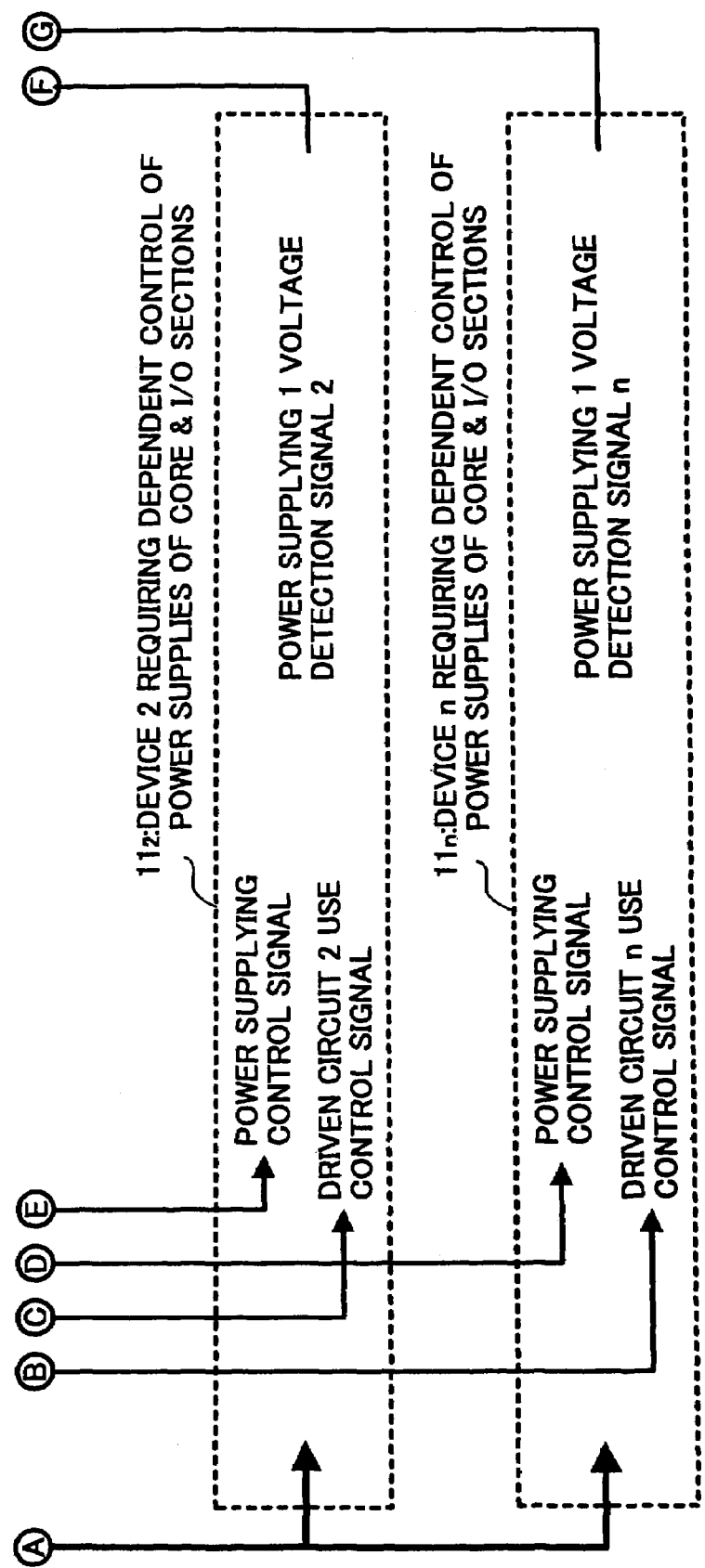
FIG. 9 is a block chart for illustrating a fourth embodiment of the power supply apparatus.

A fourth embodiment is now described with reference to FIG. 9. The embodiment of FIG. 2 may include a secondary power supplying circuit use control signal generation circuit 17 in each of the devices. In contrast thereto, in this fourth embodiment, a device 111 that should firstly operates may include a secondary power supplying circuit use control signal generation circuit that is commonly utilized by remaining devices 112 to 11n. In addition, this embodiment does not supply a power from the primary power supplying circuit, unlike the second embodiment, but supplies power from a battery or a system stabilizing power supplying circuit, thereby seeking to decrease scale by a decreased load on a power supplying circuit. Specifically, this embodiment thus seeks to minimize a circuit scale by simplifying a control circuit use power supplying circuit.

The remaining portions and functions may be similar to those described in the second embodiment except for the following applicable devices and functions.

The power source 10 may supply each of the primary power supplying circuits 191 to 19n with electric power. The primary power supplying circuits 191 to 19n may supply the driven circuit 16 with the electric power. The power supply 1 voltage detection circuit 14 may detect a voltage of the primary power supplying circuit 191. The detection result may be given to the power supplying circuit use control signal generation circuit 8 as a power supplying control signal 1.

In this embodiment, a device 111 that should firstly operates may include a power supplying circuit use control signal generation circuit 8 and a control signal generation circuit use power supplying circuit 7. Remaining devices 112 to 11n can commonly utilize these circuits. Further, the secondary power supplying circuit for each device may be supplied with power from the power source 10. In other respects, the configuration may be similar to that of the second embodiment. Further, since the secondary power supplying circuit use the control signal generation circuit 8 in remaining devices 112 to 11*n*, condition detection signals output from the respective devices 112 to 11*n* may be given to the secondary power supplying circuit use control signal generation circuit 8.

Figure 11:
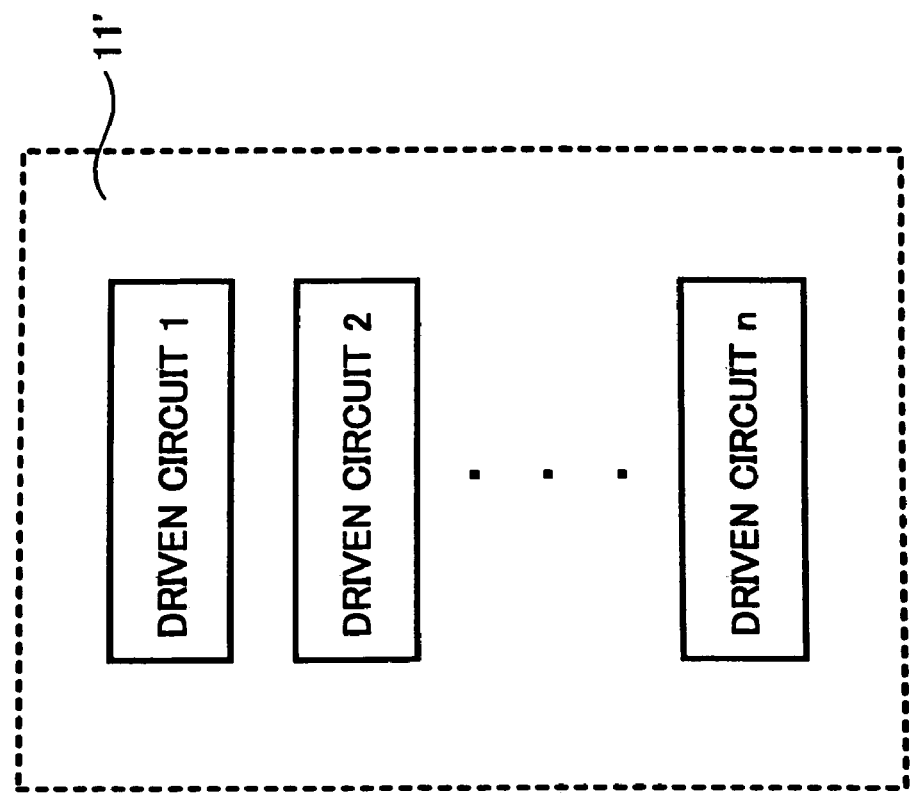
FIG. 11 is a block chart for illustrating another exemplary driven circuit.
Figure 10:
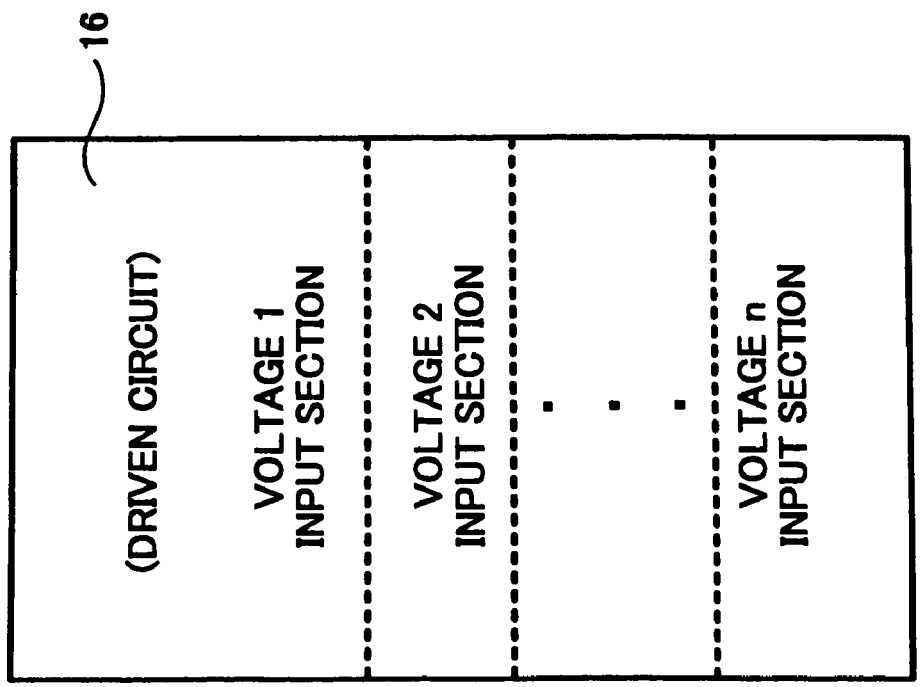
FIG. 10 is a block chart for illustrating an exemplary driven circuit.

In the above-described embodiment illustrated in FIG. 10, an exemplary driven circuits in which two or more power supplies should be dependently controlled in core and I/O sections is described as a driven circuit 16. However, such example is also applicable to a system 11' arranged to provide a single power supply to a plurality of circuits 1 to n as illustrated in FIG. 11.

In this way, the above-described embodiment may be applied not only to a device in which two or more electric power sources are dependently controlled to be supplied in core and I/O sections, but also to an apparatus configured by driven circuits that operates with different voltages. As a result, power consumption may be reduced and a circuit may be downsized.

Figure 12:
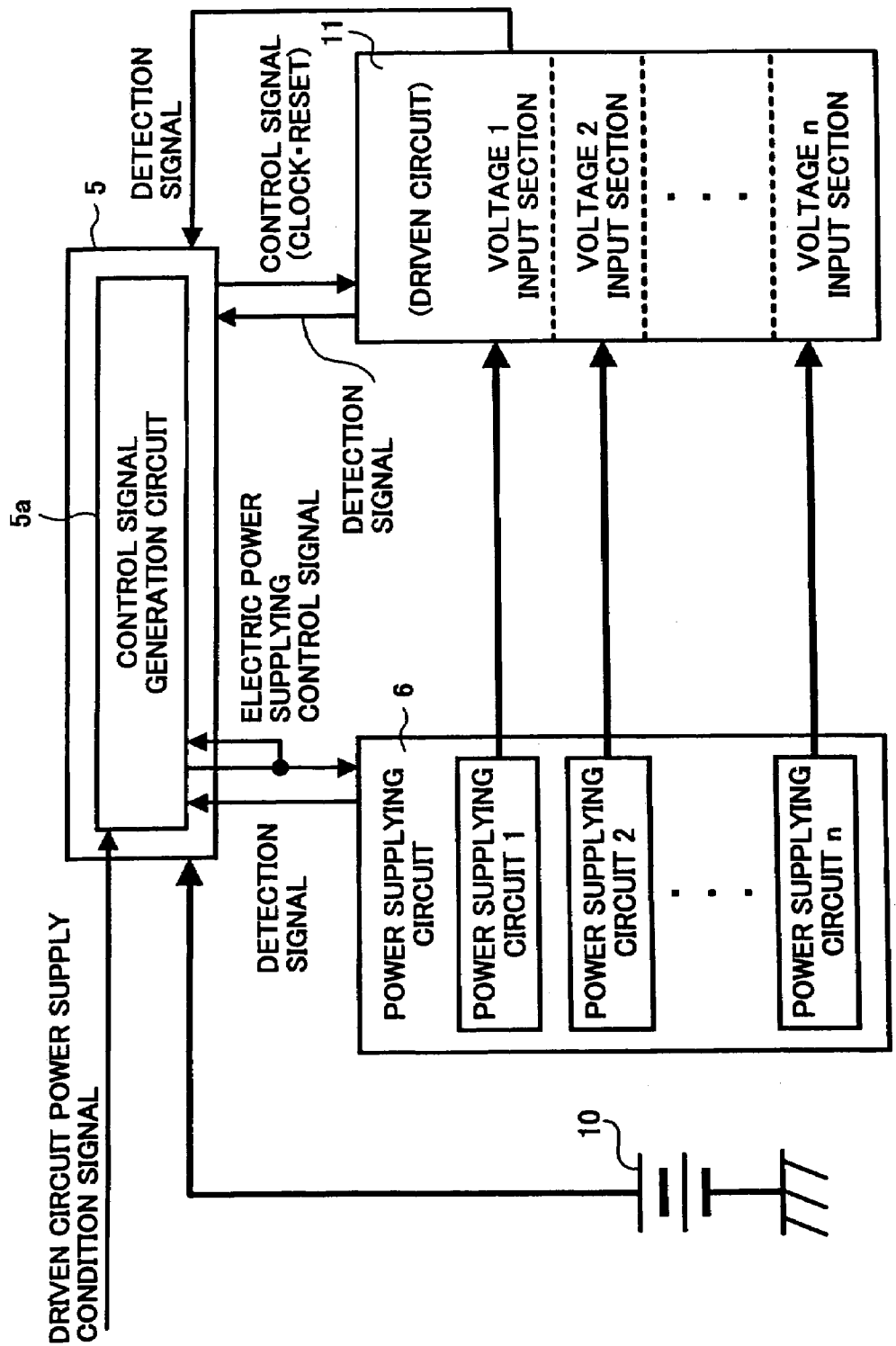
FIG. 12 is a block chart for illustrating a fifth embodiment of a power supply apparatus.

FIG. 12 is a block chart illustrating a fifth embodiment. The system of FIG. 12 may include a device 11, in which two or more different powers should be dependently controlled to be supplied in core and I/O sections in a similar manner to the first embodiment. The fifth embodiment includes almost the same configurations and functions to the second embodiment except for the following applicable configurations and functions.

As illustrated in FIG. 12, electric power of a power source 10 may be supplied to a driven circuit 5 that performs a main control or the like as a principal. In FIG. 12, although a single circuit is described as the driven circuit 5 for convenience sake, and the driven circuit 5 is practically independently configured as a main circuit, it may be configured with a part of a circuit of the driven circuit 11 as mentioned later.

The control signal generation circuit 5*a* may receive a driven circuit power supply condition signal from the system, a feed back signal from the electric power supplying signal, a control signal such as a clock signal, a reset signal, etc., and a power supply voltage detection signal from the voltage detection circuit provided in the power supplying circuit 6. The control signal generation circuit 5*a* may then output a driven circuit use control signal such as a driven circuit use clock, a reset signal, etc., and electric power supplying control signals 1 to n.

Timings and order of turning ON/OFF of the respective voltage 2 to n input sections ON/OFF may be determined and controlled by the electric power supplying control signals 1 to n. As a result, power consumption can be lowered. In addition, the control signal generation circuit 5*a* may receive feedback of the electric power supplying control signal. The driven circuit 11 may be driven in a prescribed order in accordance with its condition.

Figure 13:
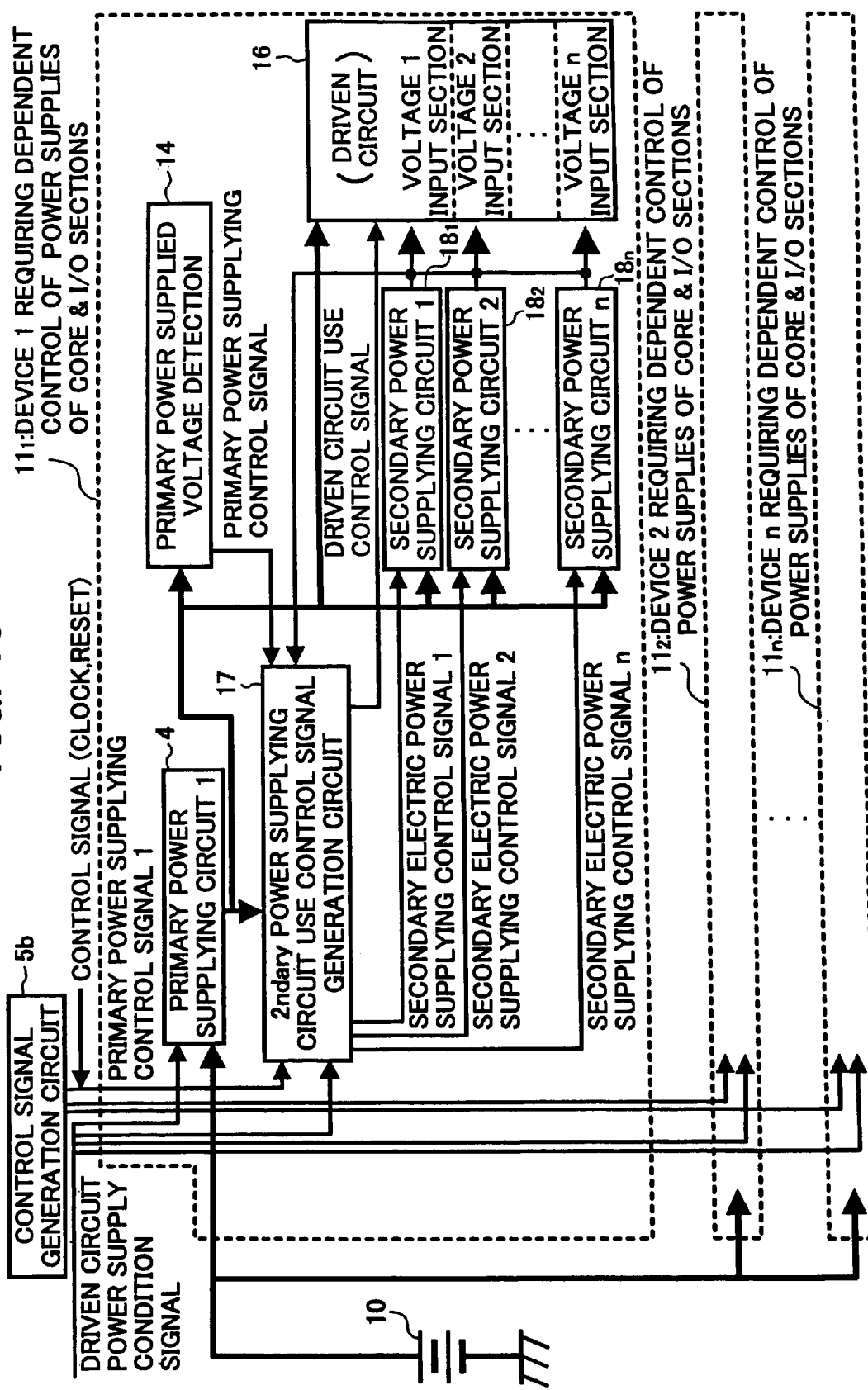
FIG. 13 is a block chart for illustrating a sixth embodiment of a power supply apparatus.

A sixth embodiment of the present invention is now described with reference to FIG. 13. The sixth embodiment may constitute the control signal generation circuit 5*a* of FIG. 12 by a first control signal generation circuit for generating clock and reset signals, and a secondary power supplying circuit use control signal generation circuit 17 that is provided in a device 11 in which two or more power sources of its core and I/O sections should be dependently controlled. Also in the driven circuit 16 provided in the device 11, one or more circuits to which two or more power supplies should be dependently controlled to be given are provided in its core and I/O sections. When comparing with the second embodiment of FIG. 2, the former has almost the same configurations and functions therewith except for a feed back signal given to the secondary power supplying circuit use control signal generation circuit 17. Specifically, the second embodiment assigns a condition signal from the driven circuit 16 as the feedback signal. In contrast, the embodiment of FIG. 13 uses a signal from the secondary electric power supplying control signal as the feedback signal, and the remaining configuration may be substantially the same.

Also in the sixth embodiment, various signals of FIG. 4 may be output under the conditions of FIG. 3. FIG. 14 is a chart illustrating a specific embodiment of a secondary power supplying circuit use control signal generation circuit 17.

As illustrated in FIG. 14, a combination circuit and delaying circuit may form the secondary power supplying circuit use control signal generation circuit 17. The secondary power supplying circuit use control signal generation circuit 17 may receive a driven circuit power supply condition signal from a system controller, a control signal such as a reset signal from a control signal generation circuit, and a primary power supply voltage detection signal from a primary power supply voltage detection circuit. The secondary power supplying circuit use control signal generation circuit 17 may control a memory circuit 170, a condition change detection circuit 171 for detecting time up, and a counter circuit 172 to output a driven circuit use control signal such as clock and reset signals, a primary electric power supplying control signal, and secondary electric power supplying control signals 1 to n, respectively.

Figure 15B:
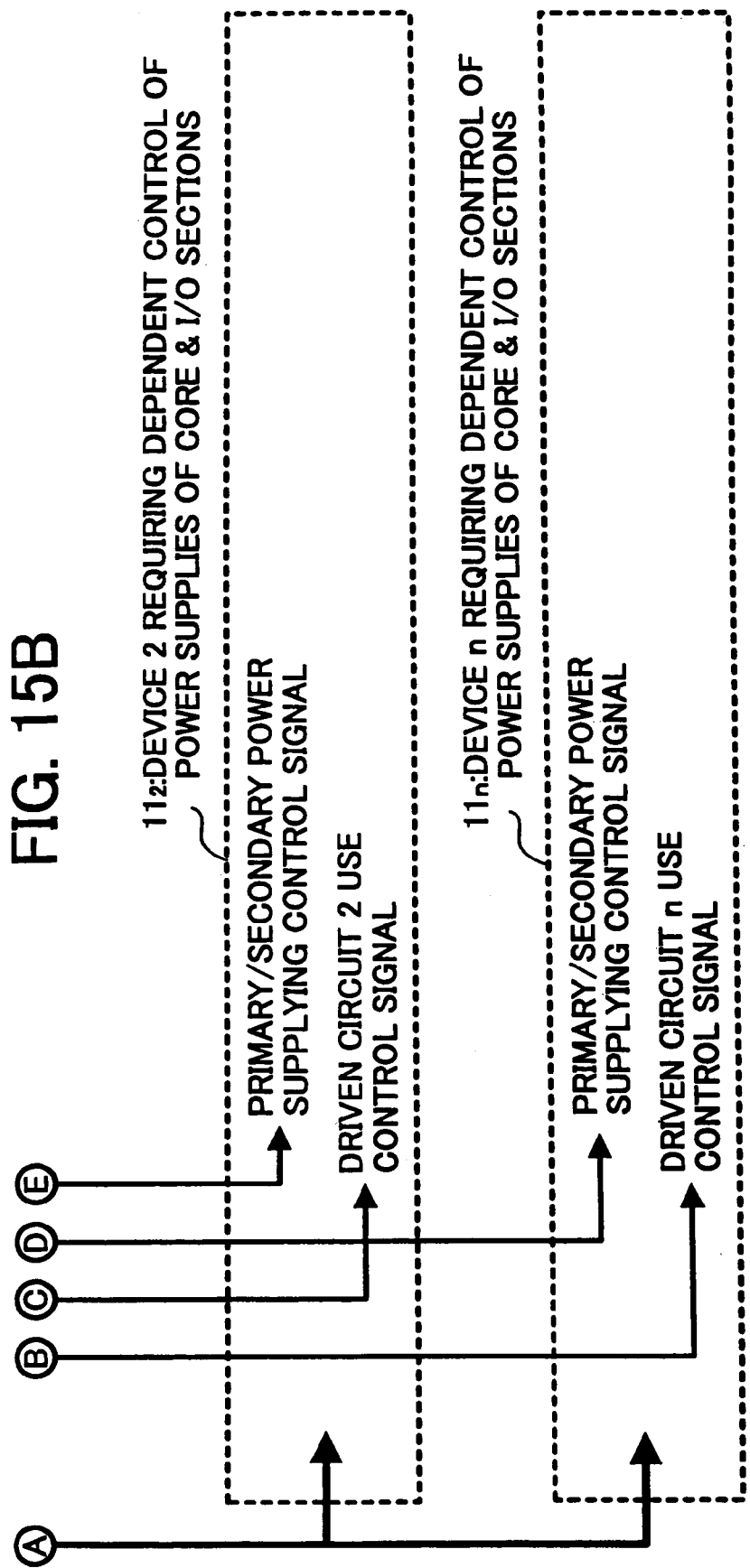
FIG. 15 is a block chart for illustrating a seventh embodiment of a power supply apparatus.

A seventh embodiment of the present invention is now described with reference to FIG. 15. When comparing with the third embodiment of FIG. 8, the embodiment of FIG. 15 has almost the same configurations and functions therewith except for a feedback signal given to the secondary power supplying circuit use control signal generation circuit 17. Specifically, the third embodiment assigns a condition signal from the driven circuit 16 as the feedback signal. In contrast, the embodiment of FIG. 15 uses a signal from the secondary electric power supplying control signal as the feedback signal, and the remaining configuration may be substantially the same.

Figure 16A:
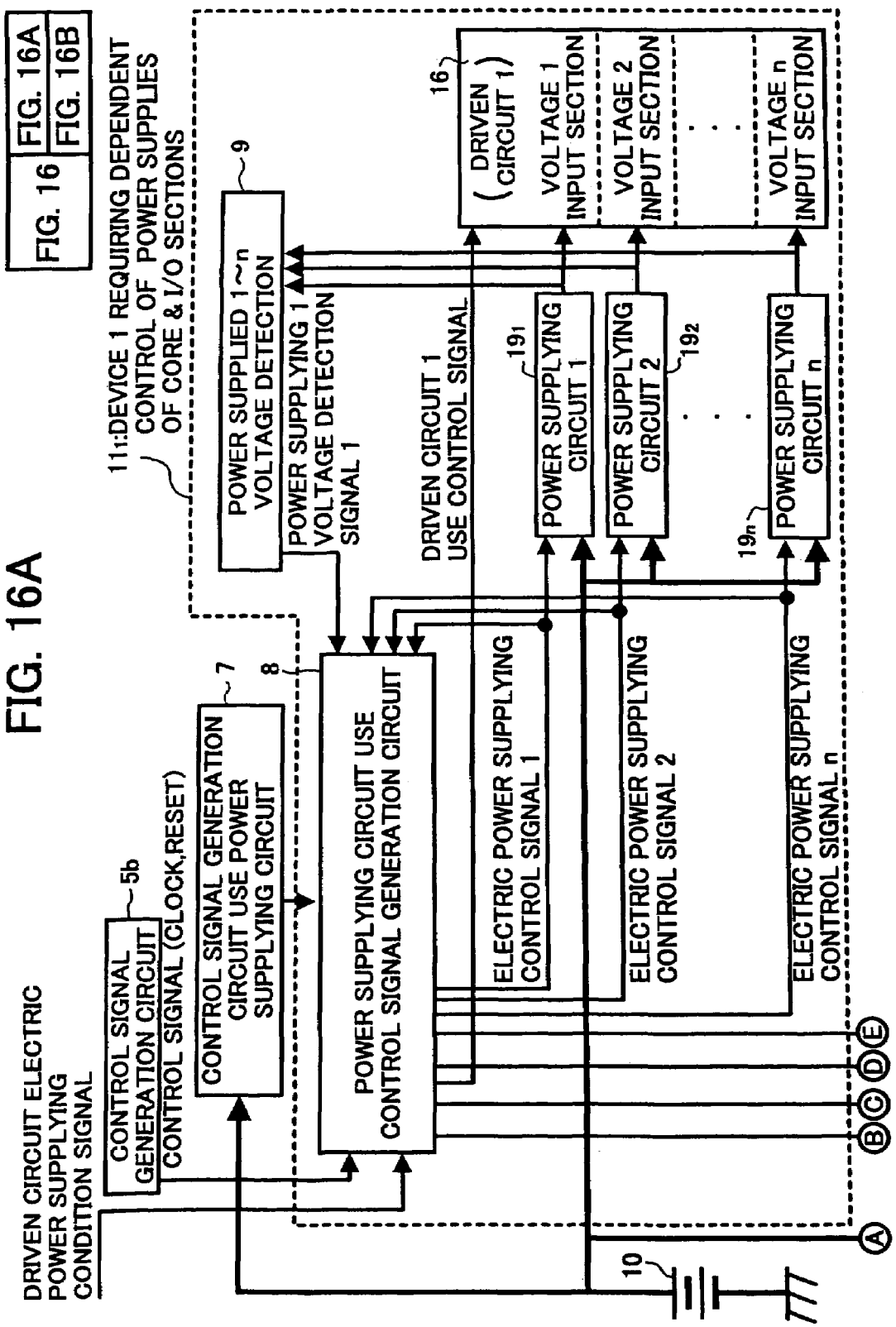
FIG. 16 is a block chart for illustrating a eighth embodiment of a power supply apparatus.
Figure 17:
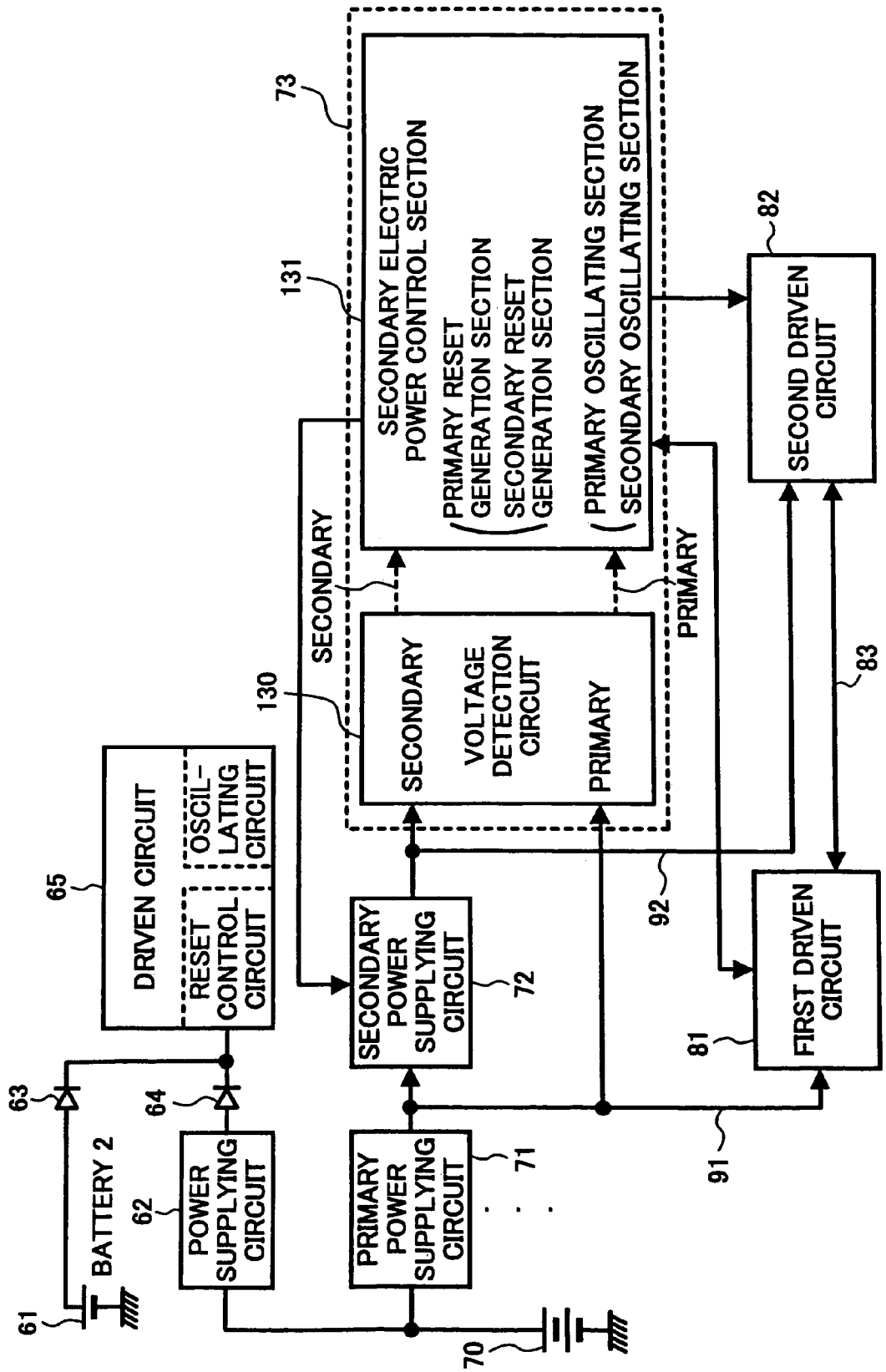
FIG. 17 is a block chart for illustrating a conventional power supply apparatus.
Figure 18:
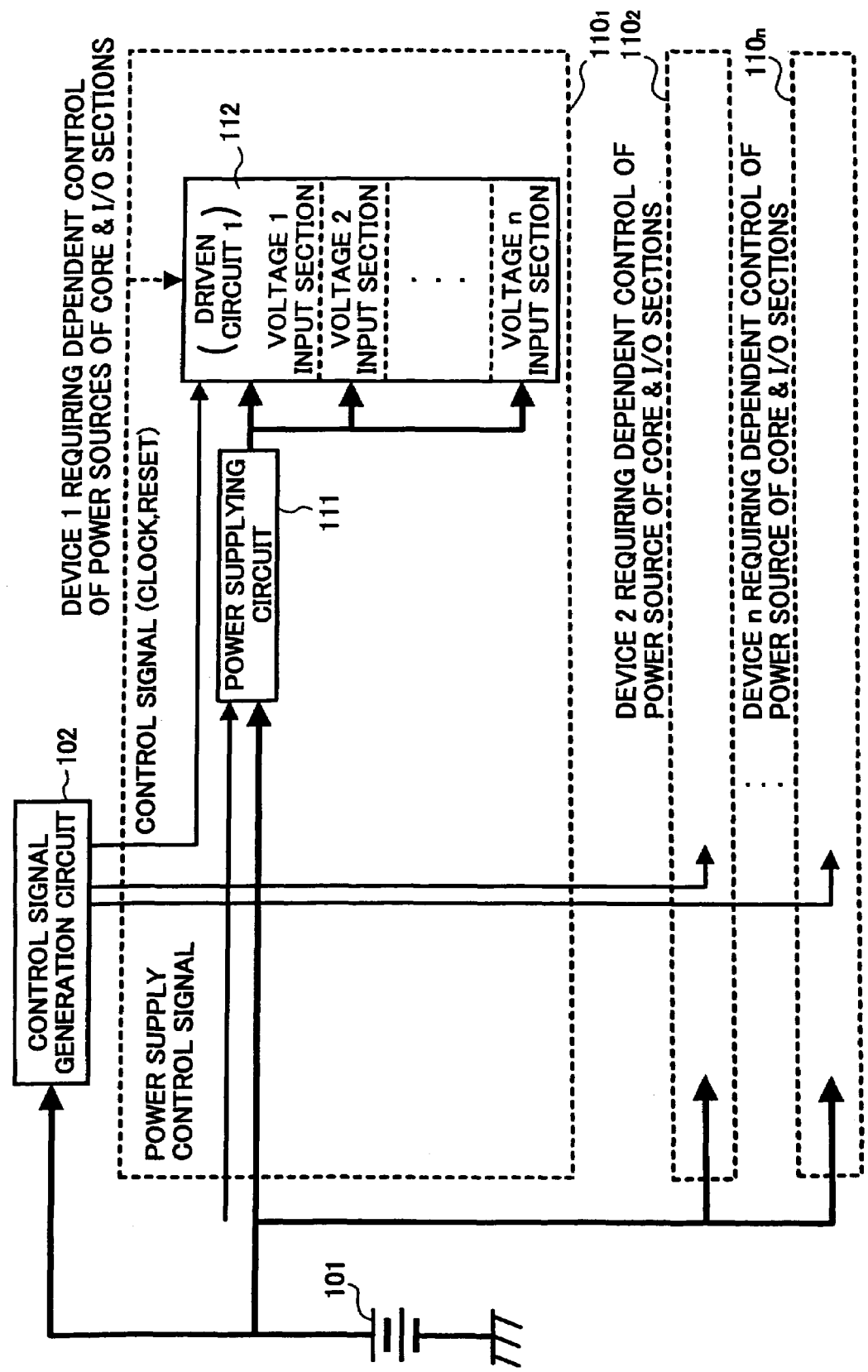
FIG. 18 is a block chart for illustrating in detail a portion of the conventional power supply apparatus illustrated in FIG. 17.
Figure 19:
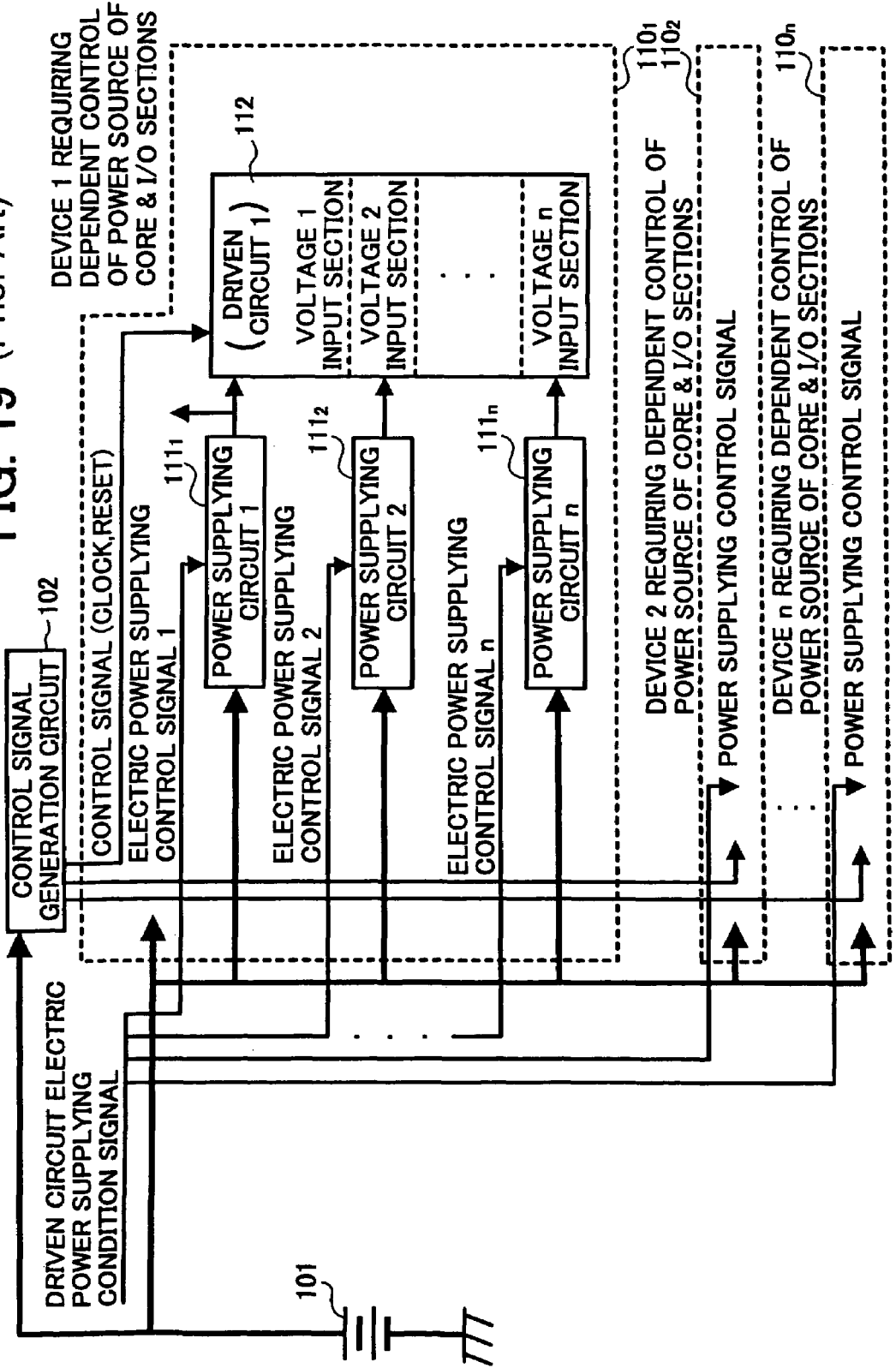
FIG. 19 is a block chart for illustrating in detail another portion of the conventional power supply apparatus illustrated in FIG. 17.

An eighth embodiment of the present invention is described with reference to FIG. 16. When comparing with the fourth embodiment, the eight embodiment of FIG. 16 has almost the same configurations and functions therewith except for that a feed back signal is given to the power supplying circuit use control signal generation circuit 8. Specifically, the fourth embodiment uses a condition signal from the driven circuit 16 as a feedback signal. In contrast, the embodiment of FIG. 16 uses a signal from a electric power supplying control signal as the feedback signal, and the remaining configuration may be substantially the same with the embodiment of FIG. 9.

The mechanisms and processes set forth in the present patent specification may be implemented using one or more conventional general purpose microprocessors and/or signal processors programmed according to the teachings in the present disclosure as will be appreciated by those skilled in the relevant arts. Appropriate software coding can readily be prepared by skilled programmers based on the teachings of the present disclosure, as will also be apparent to those skilled in the relevant arts. However, as will be readily apparent to those skilled in the art, the present teaching also may be implemented by the preparation of application-specific integrated circuits by interconnecting an appropriate network of conventional component circuits or by a combination thereof with one or more conventional general purpose microprocessors and/or signal processors programmed accordingly. The present system thus also includes a computer-based product which may be hosted on a storage medium and include, but is not limited to, any type of disk including floppy disks, optical disks, CD-ROMs, magnet-optical disks, ROMs, RAMs, EPROMs, EEPROMs, flash memory, magnetic or optical cards, or any type of media suitable for storing electronic instructions.

Numerous additional modifications and variations of the present invention are possible in light of the above teachings. It is therefore to be understood that within the scope of the appended claims, the present invention may be practiced otherwise than as specifically described herein.

This application claims priority under 35 USC §119 to Japanese Patent Application No. 2001-086584 filed on Mar. 26, 2001, the entire contents of which are herein incorporated by reference.

What is claimed as new and desired to be secured by Letter Patent of the United States is:

1. A semiconductor power supplying apparatus driven by at least one power source, said semiconductor power supplying apparatus comprising:
   at least two driven circuits driven by electric power;
   an electric power supplying circuit configured to convert electrical power from the power source and supply the at least two driven circuits with electric power in accordance with voltages that the driven circuits need;
   a driven circuit power supplying condition signal generating device configured to generate a driven circuit power supplying condition signal for determining a power supplying condition of the at least two driven circuits; and
   a power supplying control signal generation circuit configured to generate a power supplying control signal for controlling operations of the power supplying circuit,
   wherein said power supplying control signal is generated on a basis of the driven circuit power supplying condition signal and determines an order of supplying power to the at least two driven circuits so that the at least two driven circuits can receive dependent power supplying.

2. The semiconductor power supplying apparatus of claim 1, wherein said power supplying circuit supplies to said power supplying control signal generation circuit a detection signal indicating an amount of a power supply voltage supplied by said power supplying circuit.

3. The semiconductor power supplying apparatus of claim 2, wherein said power supplying control signal generation circuit generates said power supplying control signal, for controlling the operations of the power supplying circuit on a basis of the driven circuit power supplying condition signal and said detection signal.

4. A semiconductor power supplying apparatus comprising:
   at least two driven circuits driven by electric power;
   an electric power supplying circuit converting electrical power from a power source and supplying the at least two driven circuits with electric power according to the needs of the driven circuits,
   a powersupplying condition signal generating device configured to generate a driven circuit power supplying condition signal which specifies a power supplying condition of the at least two driven circuits; and
   a power supplying control signal generation circuit,
   wherein said power supplying control signal generation circuit generates a power supplying control signal for controlling operations of the electric power supplying circuit based on the driven circuit power supplying condition signal, and the power supplying control signal specifies an order of supplying power to the at least two driven circuits.

5. The semiconductor power supplying apparatus of claim 4, wherein said power supplying condition specified by the driven circuit power supplying condition signal is related to turning ON/OFF of the at least two driven circuits.

6. The semiconductor power supplying apparatus of claim 4, further comprising a main power supplying circuit which supplies power to at least a portion of one of the driven circuits, wherein one or more of the driven circuits that is supplied with power is turned ON only after said main power supplying circuit has been turned ON.

7. The semiconductor power supplying apparatus of claim 6, wherein said main power supplying circuit is a most frequently utilized power supplying circuit.

8. The semiconductor power supplying apparatus of claim 4, wherein the driven circuits include core and I/O sections requiring two or more power supplies, and said two or more power supplies are dependently controlled.

9. The semiconductor power supplying apparatus of claim 8, wherein said two or more power supplies that are dependently controlled are controlled such that additional driven circuits are turned ON only when a main power supplying circuit is turned ON.

10. The semiconductor power supplying apparatus of claim 4, further comprising a main power supplying circuit which supplies power to at least a portion of one of the driven circuits, and said main power supplying circuit is the most frequently utilized power supplying circuit.

11. The semiconductor power supplying apparatus of claim 4, wherein the driven circuits use different amounts of the supplied power.

12. An electronic instrument including the semiconductor power supplying apparatus of claim 4.

13. A mobile phone including the semiconductor power supplying apparatus of claim 4.

14. A mobile information terminal including the semiconductor power supplying apparatus of claim 4.

* * * * *